(12) United States Patent
Iverson

(10) Patent No.: US 10,489,539 B2
(45) Date of Patent: Nov. 26, 2019

(54) VIRTUAL TERMINALS FOR LINEAR-PARAMETER EXTRACTION

(71) Applicant: Synopsys, Inc., Mountain View, CA (US)

(72) Inventor: Ralph Iverson, Arlington, MA (US)

(73) Assignee: Synopsys, Inc., Mountain View, CA (US)

( * ) Notice: Subject to any disclaimer, the term of this patent is extended or adjusted under 35 U.S.C. 154(b) by 95 days.

(21) Appl. No.: 15/713,506

(22) Filed: Sep. 22, 2017

(65) Prior Publication Data

US 2018/0089353 A1    Mar. 29, 2018

Related U.S. Application Data

(60) Provisional application No. 62/399,253, filed on Sep. 23, 2016.

(51) Int. Cl.
*G06F 17/50* (2006.01)
*G06F 16/25* (2019.01)

(52) U.S. Cl.
CPC ........ *G06F 17/5036* (2013.01); *G06F 16/258* (2019.01); *G06F 17/505* (2013.01); *G06F 17/5072* (2013.01); *G06F 17/5081* (2013.01)

(58) Field of Classification Search
CPC .. G06F 16/258; G06F 17/5036; G06F 17/505; G06F 17/5072; G06F 17/5081
See application file for complete search history.

(56) References Cited

U.S. PATENT DOCUMENTS

| | | | | |
|---|---|---|---|---|
| 5,521,555 A * | 5/1996 | Tazartes | ............... | G01J 1/44 250/214 A |
| 5,774,216 A * | 6/1998 | Priddy | ............... | G01C 19/664 356/475 |
| 6,687,887 B1 * | 2/2004 | Teig | ............... | G06F 17/5036 716/115 |
| 7,103,524 B1 * | 9/2006 | Teig | ............... | G06F 17/5081 703/14 |
| 7,200,825 B2 * | 4/2007 | Watson | ............... | G06F 17/5081 324/613 |
| 7,283,082 B1 * | 10/2007 | Kuyel | ............... | H03M 1/682 341/145 |
| 7,669,152 B1 * | 2/2010 | Tcherniaev | ............... | G06F 17/5036 716/136 |

(Continued)

OTHER PUBLICATIONS

Lim et a., "Characterization of Interconnect Process Variation in CMOS Using Electrical Measurements and Field Solver"; IEEE Transactions on Electron Devices (Year: 2014).*

(Continued)

*Primary Examiner* — Helen Rossoshek
(74) *Attorney, Agent, or Firm* — HIPLegal LLP; Judith Szepesi

(57) ABSTRACT

A method to evaluate a resistor structure is described. In one embodiment, the method includes receiving an input file specifying a resistor structure, modifying at least one aspect of the resistor structure, and polishing data representing the modified resistor structure. The method further comprises, in one embodiment, initializing at least one walk, and performing the walk, and providing an output about the resistor structure based on the performed at least one walk.

22 Claims, 15 Drawing Sheets

Resistance Extractor Flow Chart

(56) References Cited

U.S. PATENT DOCUMENTS

| | | | | |
|---|---|---|---|---|
| 7,675,449 | B2* | 3/2010 | Confalonieri | H03M 1/0648 341/144 |
| 7,747,355 | B2* | 6/2010 | Bulthaup | H02P 9/06 290/1 C |
| 7,805,697 | B2* | 9/2010 | Wood | G06F 17/5036 716/113 |
| 7,908,573 | B2* | 3/2011 | Lin | G06F 17/5036 716/100 |
| 8,122,419 | B2* | 2/2012 | Elfadel | G06F 17/5036 716/104 |
| 9,223,912 | B1* | 12/2015 | Liapis | G06F 17/5081 |
| 2010/0122222 | A1* | 5/2010 | Elfadel | G06F 17/5036 716/136 |
| 2014/0269848 | A1* | 9/2014 | Schrom | H03L 7/189 375/148 |
| 2016/0342729 | A1* | 11/2016 | Visvardis | G06F 17/5018 |
| 2017/0147729 | A1* | 5/2017 | Svizhenko | G06F 17/505 |
| 2017/0176540 | A1* | 6/2017 | Omi | H01M 10/48 |

OTHER PUBLICATIONS

Maffezzoni et al.; "Analysis of substrate coupling by means of a stochastic method"; IEEE Electron Device Letters ; (Year: 2002).*

Yu et al.; "Efficient Algorithms for Resistance and Capacitance Calculation Problems in the Design of Flat Panel Display"; 2017 IEEE 12th International Conference on ASIC (ASICON) (Year: 2017).*

Zhang et al.; "Fast Random Walk Based Capacitance Extraction for the 3-D IC Structures With Cylindrical Inter-Tier-Vias"; IEEE Transactions on Computer-Aided Design of Integrated Circuits and Systems (Year: 2015).*

Yu et al.; "RWCap: A Floating Random Walk Solver for 3-D Capacitance Extraction of Very-Large-Scale Integration Interconnects"; IEEE Transactions on Computer-Aided Design of Integrated Circuits and Systems (Year: 2015).*

Iverson et al.; "A Multi-Scale Random-Walk Thermal-Analysis Methodology for Complex IC-Interconnect Systems"; IEEE Transactions on Computer-Aided Design of Integrated Circuits and Systems (Year: 2015).*

Chatterjee et al.; "Development of a Random-Walk Algorithm for IC-Interconnect Analysis: 20 TE Benchmarks, Materially Homogeneous Domains"; Proceedings of the IEEE 2000 International Interconnect Technology (Year: 2000).*

Brambilla et al.; "Statistical Method for the Analysis of Interconnects Delay in Submicrometer Layouts"; IEEE Transactions on Computer-Aided Design of Integrated Circuits and Systems (Year: 2001).*

Xu et al.; "Floating Random Walk-Based Capacitance Extraction for General Non-Manhattan Conductor Structures"; IEEE Transactions on Computer-Aided Design of Integrated Circuits and Systems (Year: 2017).*

Jere et al.; "An Improved Floating-Random-Walk Algorithm for Solving the Multi-Dielectric Dirichlet Problem"; IEEE Transactions on Microwave Theory and Techniques (Year: 1993).*

* cited by examiner

Figure 1: Resistance Extractor Flow Chart

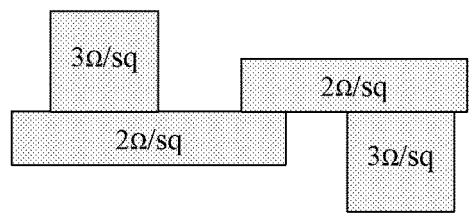
Figure 2
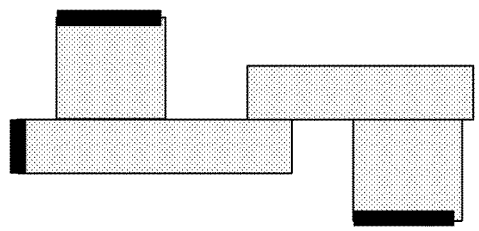
Figure 3
   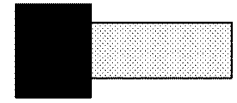
Figure 4A     Figure 4B     Figure 4C     Figure 4D
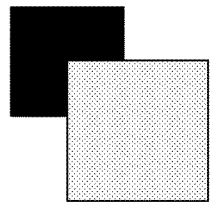 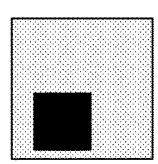 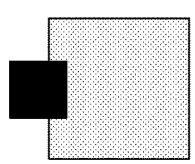 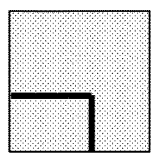 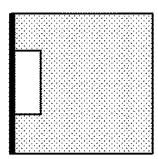
Figure 5A     Figure 5B     Figure 5C     Figure 5D     Figure 5E

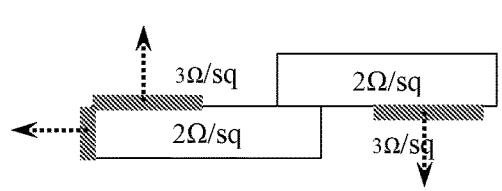
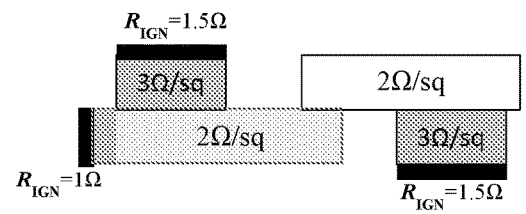
Structure with Resistor Terminals
Implied Structure
Figure 6A
Figure 6B
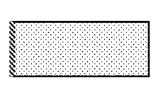 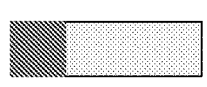 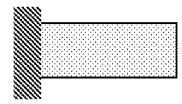  
Figure 7A  Figure 7B  Figure 7C  Figure 7D  Figure 7E
  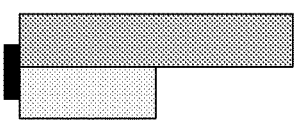
Figure 8A  Figure 8B  Figure 8C

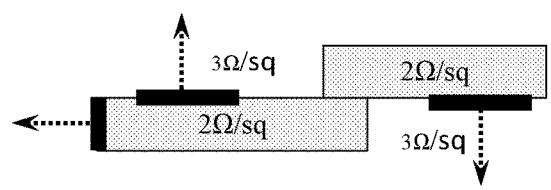
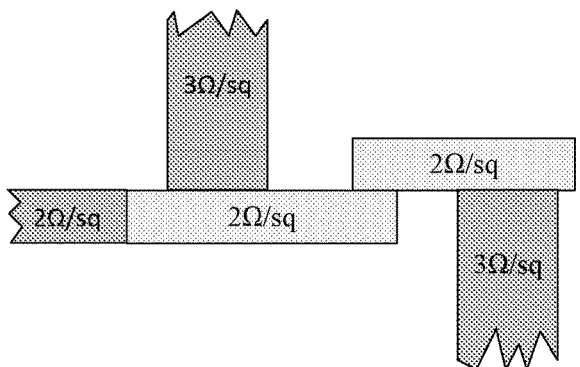
Structure with Current Terminals
Implied Structure
Figure 9A
Figure 9B
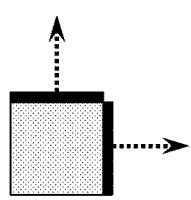
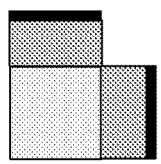
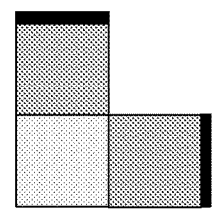
Figure 10A
Figure 10B
Figure 10C
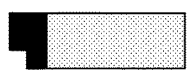
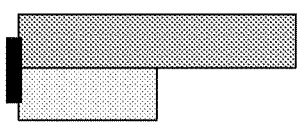
Figure 11A
Figure 11B
Figure 11C

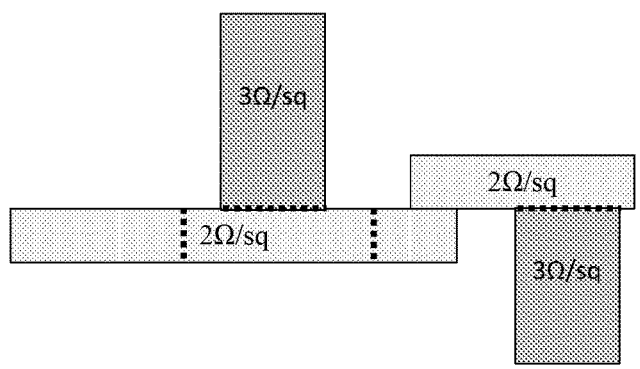
Figure 12
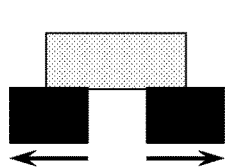     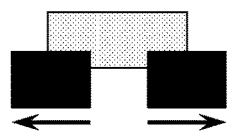     
Figure 13A            Figure 13B            Figure 13C
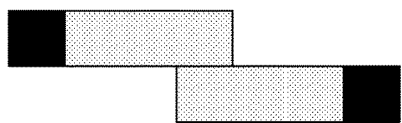     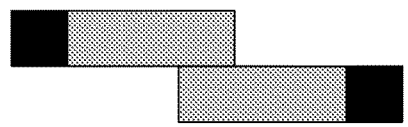     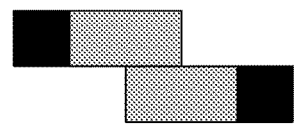
Figure 14A            Figure 14B            Figure 14C

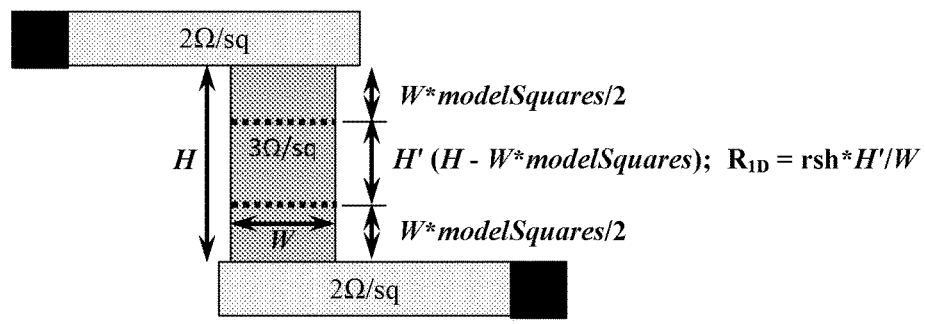
Figure 18
Figure 19A
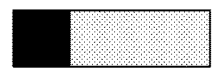
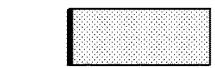
Figure 19B
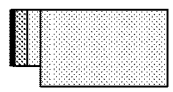
Figure 20

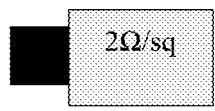 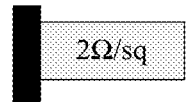 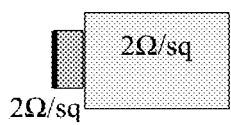 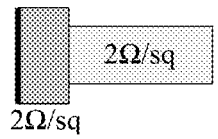
Figure 21A  Figure 21B  Figure 21C
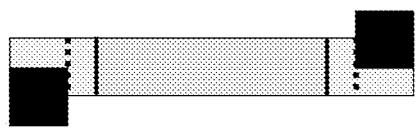
Figure 22
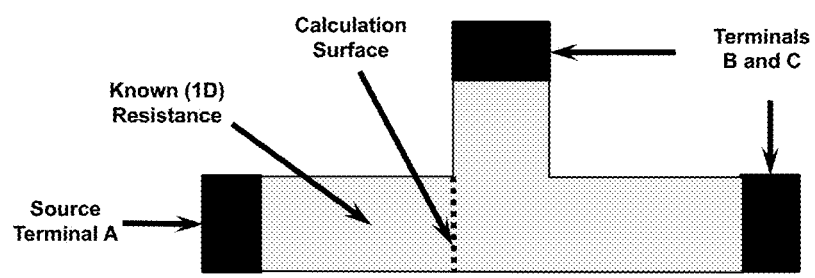
Figure 23

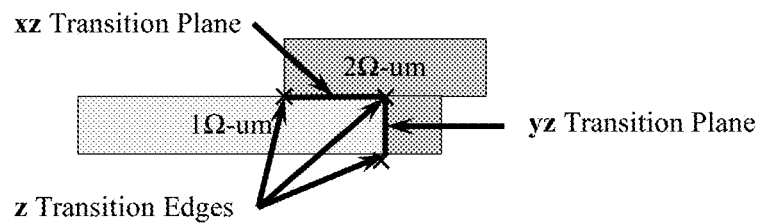
Figure 27
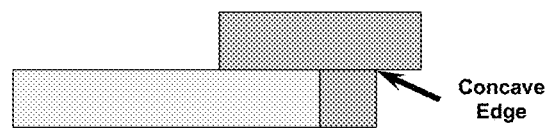
Figure 28
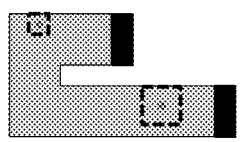 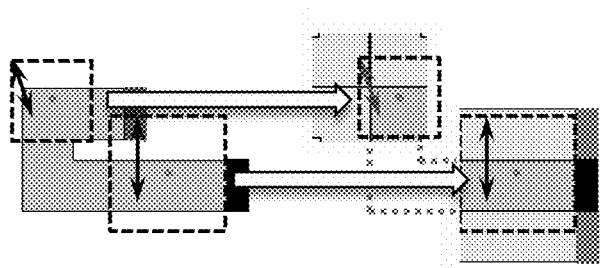
Figure 29A      Figure 29B      Figure 29C

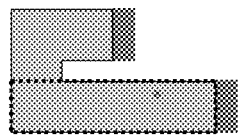
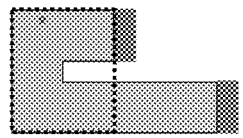
Figure 30A    Figure 30B
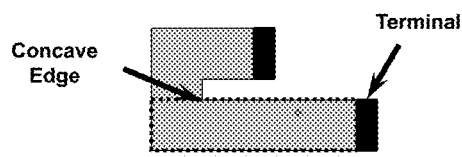
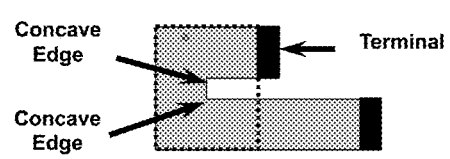
Figure 31A    Figure 31B
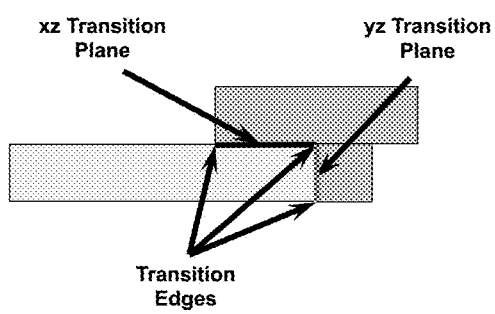
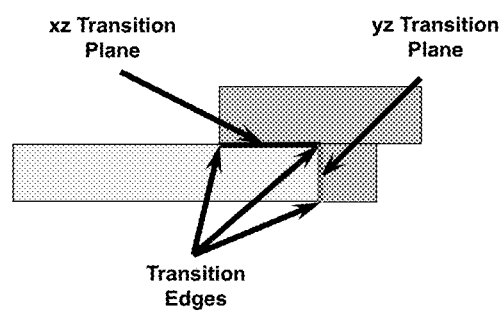
Figure 32A    Figure 32B

*xy Cross Section of a 3D Resistor Structure*

*2D Resistor Structure*

∇ Network

Y Network

VIRTUAL TERMINALS FOR LINEAR-PARAMETER EXTRACTION

RELATED APPLICATION

The present application is related to U.S. Provisional Patent No. 62/399,253, filed on Sep. 23, 2016, and incorporates that application in its entirety.

BACKGROUND

A resistor structure (for analysis) consists of connected materials of various resistivity values and at least two terminals that traditionally impose Dirichlet boundary conditions (fixed voltage). The external faces of the resistor structure impose reflective boundary conditions. The results are parameters that specify the linear relationship between the voltages on the terminals and the currents in or out of each terminal.

Though a random-walk approach has been considered for resistance extraction, it cannot be implemented due to differences between capacitance and resistance that make the technique impossible to implement on a cost and time effective basis. Thus, there has been a long felt need for a better method of evaluating resistance.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2 is an exemplary resistor structure.

FIG. 3 is an exemplary resistor structure that includes voltage terminals in accordance with some embodiments.

FIGS. 4A-4D are examples of equivalent configurations for a voltage terminal in accordance with some embodiments.

FIGS. 5A-5E illustrate examples of various voltage terminal configurations in accordance with some embodiments.

FIGS. 6A and 6B illustrate an exemplary resistor structure with resistor terminals and a corresponding implied structure in accordance with some embodiments.

FIGS. 7A-7E illustrate exemplary resistance terminal structures and associated implementations with a model-squares parameter defining an aspect ratio of 1/2 in accordance with some embodiments.

FIGS. 8A-8C illustrate resistance structures that trigger errors in accordance with some embodiments.

FIGS. 9A and 9B illustrate an exemplary resistor structure with current terminals and a corresponding implied structure in accordance with some embodiments.

FIGS. 10A-10C illustrate a current terminal structure and the errors of associated resistance terminals in accordance with some embodiments.

FIGS. 11A-11C illustrate a transition-enabled terminal requiring voltage terminal representation in accordance with some embodiments.

FIG. 12 illustrates exemplary locations at which a 2D resistor structure may be partitioned in accordance with some embodiments.

FIGS. 13A-13C illustrate resistance terminals requiring specified directions in accordance with some embodiments.

FIGS. 14A-14C illustrate examples of using ignored resistance to find resistance correction in accordance with some embodiments.

FIG. 18 illustrates examples of virtual terminals inserted by the resistance extractor in accordance with some embodiments.

FIGS. 19A and 19B illustrate exemplary defined resistance terminal structures and their associated voltage terminal representations in accordance with some embodiments.

FIG. 20 illustrates an exemplary defined resistance terminal structure and an associated partial implementation in accordance with some embodiments.

FIGS. 21A-21C illustrate exemplary defined resistance terminal structures and their associated implementations in accordance with some embodiments.

FIG. 22 illustrates an exemplary resistor structure with two complex terminals in accordance with some embodiments.

FIG. 23 illustrates an exemplary average-voltage-based calculation surface for an exemplary resistance-terminal-based structure in accordance with some embodiments.

FIG. 27 illustrates transition data structures in the xy cross-section of an exemplary 3D resistor structure in accordance with some embodiments.

FIG. 28 illustrates a concave edge in an exemplary resistor structure in accordance with some embodiments.

FIGS. 29A-29C are examples to illustrate how reflection hops increase hop distance in accordance with some embodiments.

FIGS. 30A and 30B illustrate an exemplary reflection box determined by the nearest reflecting edge in each Manhattan direction in accordance with some embodiments.

FIGS. 31A and 31B illustrate examples of objects affecting the size of a hop in accordance with some embodiments.

FIGS. 32A and 32B illustrate exemplary 3D and 2D resistor structures with equivalent data structures in accordance with some embodiments.

DETAILED DESCRIPTION

Figure 1:
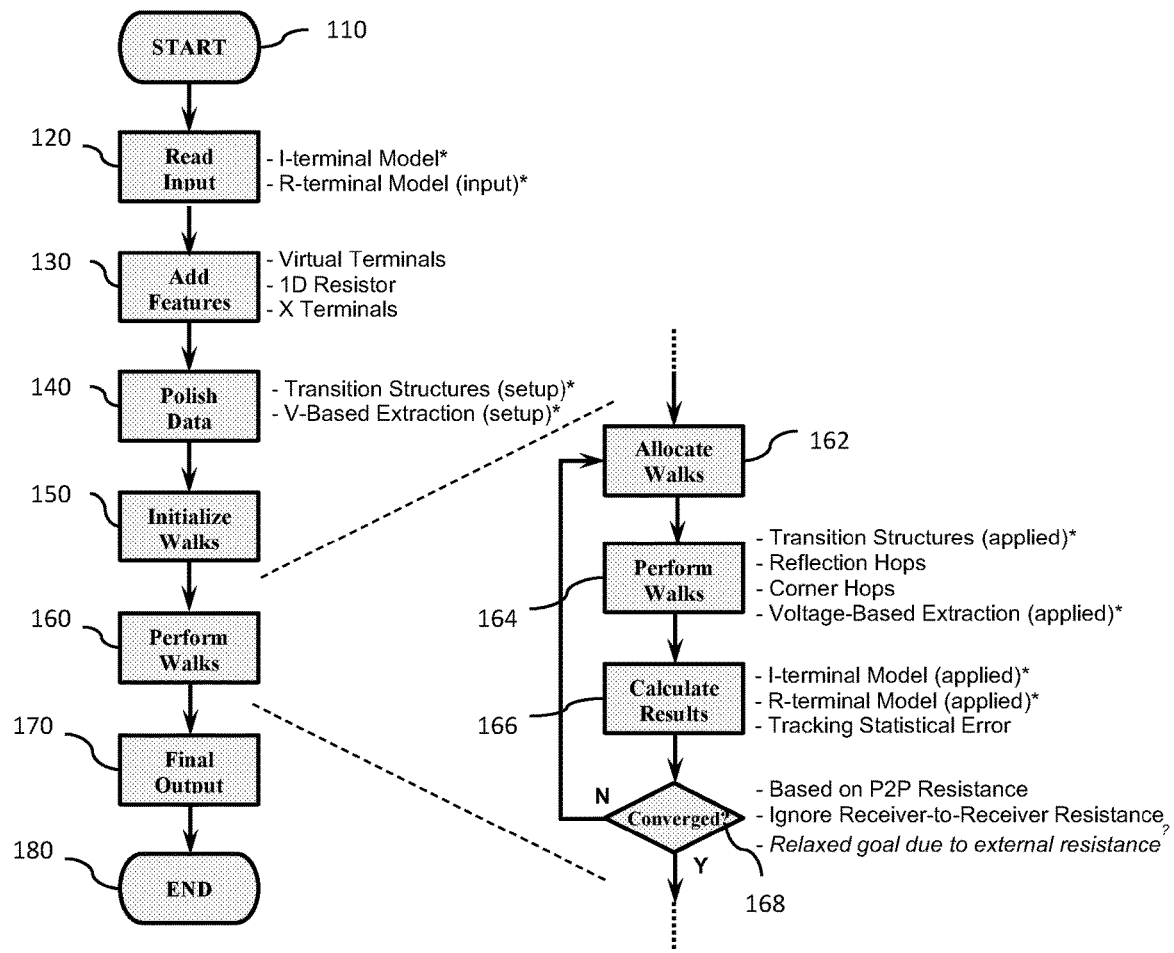
FIG. 1 is an overview flowchart of the resistance extractor in accordance with some embodiments.

The present invention relates to electronic design automation (EDA), and resistance extraction from such a design. And more particularly to a random-walk-based resistance extractor. In some embodiments, the present invention uses a floating random walk approach to estimating resistance. The random-walk approach presents issues and advantages distinct from traditional deterministic methods.

A resistor structure (for analysis) consists of connected materials of various resistivity values and at least two terminals that traditionally impose Dirichlet boundary conditions (fixed voltage). The external faces of the resistor structure impose reflective boundary conditions. The results are parameters that specify the linear relationship between the voltages on the terminals and the currents in or out of each terminal. These parameters can be presented in any of several equivalent ways.

One of the advantages of using random walk is that there is no grid to maintain. This reduces the need for memory. However, this is not as strong an advantage for resistance extraction because resistor structures are generally small and hence easier to "grid" than capacitance structures. Another advantage of random walk is that the only source of error is statistical. Dial-in accuracy provides a definite advantage, independent of implementation, as does statistical error cancellation.

However, traditional random walk has a negative impact on the speed of evaluation in several situations. This issue is addressed by the novel approaches described herein. The speed impacts are caused by flux-based calculations which can introduce significant statistical uncertainty, the limitations on hop size caused by resistor edges which can cause walks that require many hops, and the issues around the routing from one contact to another may be circuitous, so that most hops do not provide any useful information. In one embodiment, a floating random walk is used. A traditional random walk consists of hops on a grid, always between adjacent grid points, and suffers from discretization error associated with the grid. A floating random walk consists of hops, each of which is onto a continuous enclosing surface with a size only limited by the nearest objects. The floating random walk does not have discretization error.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Figure 37:
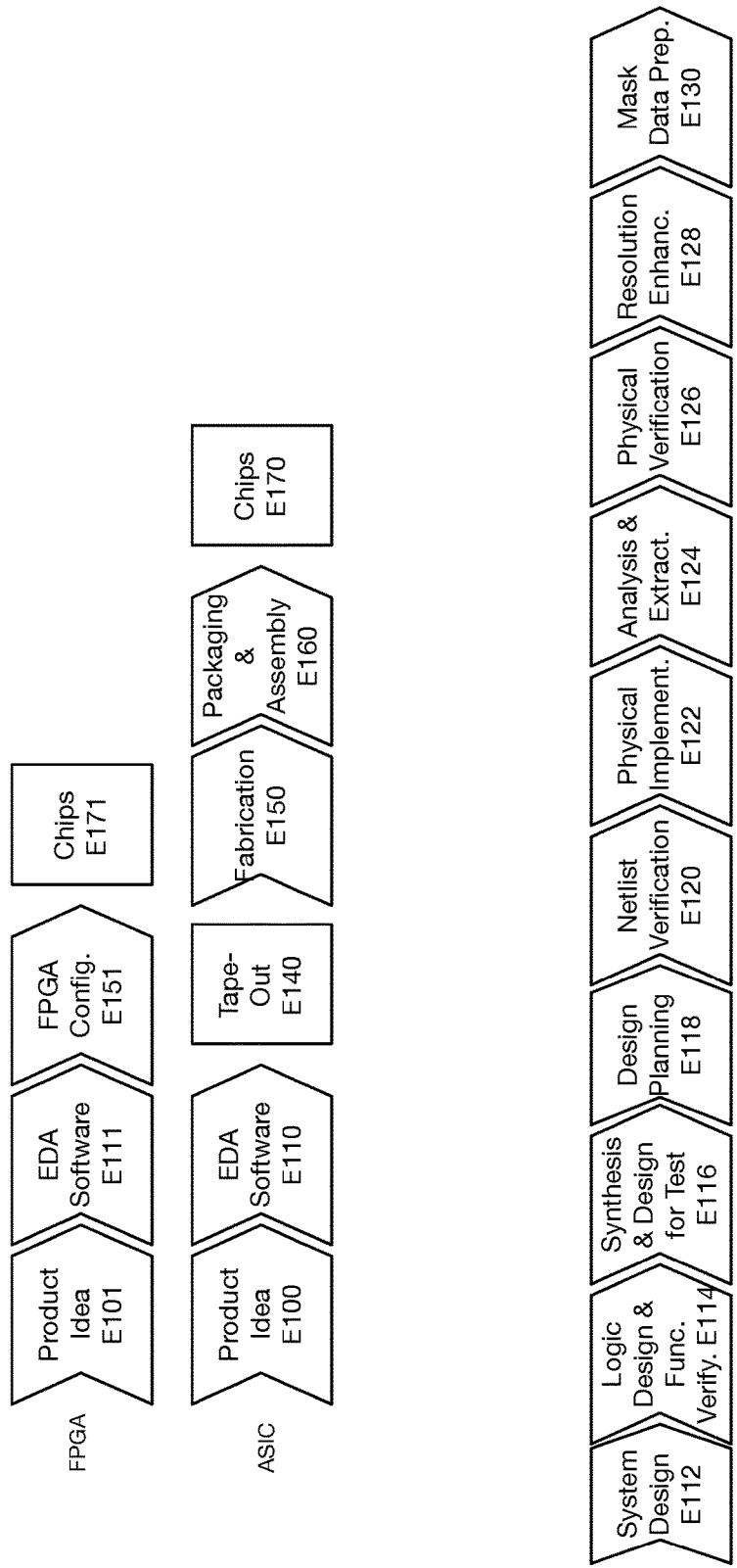
FIG. 37 shows a simplified representation of one embodiment of an electronic design automation (EDA) design flow.
Figure 38:
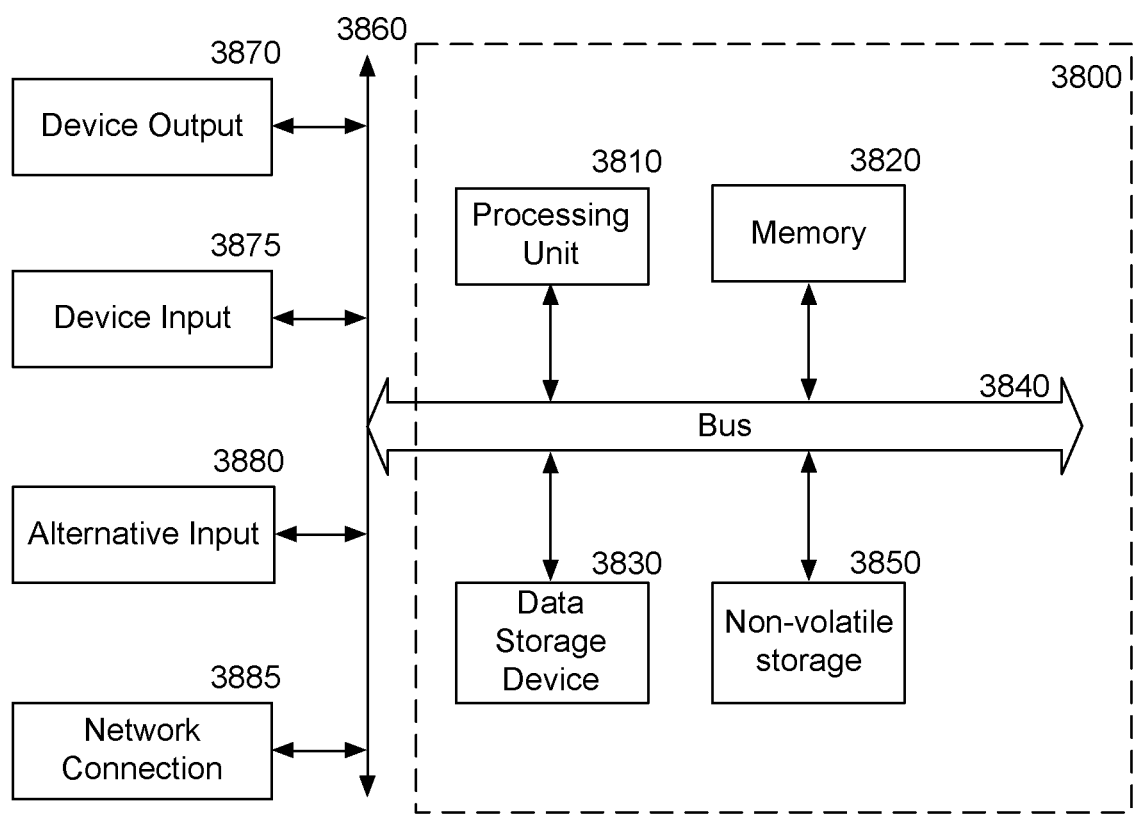
FIG. 38 is a block diagram of one embodiment of a computer system which may be utilized.

Before proceeding further with the description, it may be helpful to place these processes in context. FIG. 37 shows a simplified representation of an exemplary digital ASIC and FPGA design flow. At a high level, the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170).

The EDA software design process (step E110) is actually composed of a number of steps E112-E130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step E110) will now be provided:

System design (step E112): The designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step E114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step E116): Here, the VHDL/Verilog is translated into a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Design planning (step E118): Here, an overall floorplan for the chip is constructed and analyzed for timing and top-level routing. Exemplary EDA software products from Synopsys, Inc. that can be used at this step include Jupiter and Floorplan Compiler products.

Netlist verification (step E120): At this step, the netlist is checked for compliance with timing constraints and for correspondence with the VHDL/Verilog source code. Exemplary EDA software products from Synopsys, Inc. that can be used at this step include VCS, VERA, Formality and PrimeTime products.

Physical implementation (step E122): The placement (positioning of circuit elements) and routing (connection of the same) occurs at this step. Exemplary EDA software products from Synopsys, Inc. that can be used at this step include the Astro product.

Analysis and extraction (step E124): At this step, the circuit function is verified at a transistor level, this in turn permits what-if refinement. Exemplary EDA software products from Synopsys, Inc. that can be used at this step include Star RC/XT, Raphael, and Aurora products.

Physical verification (step E126): At this step various checking functions are performed to ensure correctness for: manufacturing, electrical issues, lithographic issues, and circuitry. Exemplary EDA software products, Inc. that can be used at this step include the Hercules product.

Resolution enhancement (step E128): This step involves geometric manipulations of the layout to improve manufacturability of the design. Exemplary EDA software products from Synopsys, Inc. that can be used at this step include iN-Phase, Proteus, and AFGen products.

Mask data preparation (step E130): This step provides the "tape-out" data for production of masks for lithographic use to produce finished chips. Exemplary EDA software products from Synopsys, Inc. that can be used at this step include the CATS® family of products.

The resistance extractor described in the present application, in one embodiment may be used in the design phase, to ensure that the resistances meet guidelines during the logic design & functional verification (E114). The resistance extractor may also be used during the analysis and extraction (E126). In one embodiment, this analysis allows users and design systems to identify critical areas of the design and improve the design for electromigration and IR Drop, improving reliability. Efficiency improvements are quickly achievable, reducing both static and switching losses.

FIG. 1 is an overview flowchart of using the resistance extractor in accordance with some embodiments. The process starts at block 110. At block 120, the input (e.g., an input file or command-line input) is read. In some embodiments, an input file may be added via a command line. The input includes the resistance structure. The input in one embodiment includes resolution related parameters, including general and corner resolutions. In one embodiment, a command line interface can also specify other run-related behavior such as convergence goals (relative and absolute), maximum run time, a random-walk seed, a parameter used to transform voltage terminals to resistor terminals, and various output formats to be generated once results have converged. In another embodiment, such goals may be specified through other means, or a default goal set may be used.

In some embodiments, the user may define a 2D or 3D structure. The dimensionality can be explicitly specified, or inferred from the input. Any input specifying a resistivity (units of Ω-m or Ω-μm) implies a 3D structure, whether for a resistor or for a resistor terminal (novel form of a terminal). Any input specifying a sheet resistance (units of Ω/sq) implies a 2D structure.

In some embodiments, the resolution-related parameters that are specified may include general resolution and corner resolution. In some embodiments, the system uses default values when the resolutions are not set by commands (e.g., in the input file).

General resolution allows the geometry to be represented as integers. In some embodiments, the random walk is implemented on an integer grid for speed. The general resolution affects interpretation of input coordinates. When two (floating-point) coordinates both round to the same (integer) grid value, in some embodiments the system considers them to be the same value. The default resolution is 0.01 Å, in some embodiments.

The corner resolution affects the hops of a random walk. It has no direct effect on the input data. The default value used by the system, in one embodiment, is the larger of (1) 1% of the smallest box dimension, and (2) 10 times the resolution.

The resistor structure may be defined by blocks of uniform material, each with its own resistivity (3D structures) in units of Ω-μm or similar; or by rectangles of uniform material, each with its own sheet resistance (2D structures) in units of n/square or similar. Except at the location of a "terminal," the outside surface of the resistor structure imposes a reflective boundary, and no current flows through this surface. Equivalently, there is a Neumann boundary condition of zero, and the perpendicular component of the gradient of the voltage is zero.

FIG. 2 shows an exemplary 2D resistor structure defined by four rectangles in accordance with some embodiments. In some embodiments, when resistor boxes (3D) or rectangles (2D) with different resistances overlap, the later-defined shape takes precedence. This precedence choice is arbitrary.

Terminals indicate where current can enter or leave a resistor structure. In one embodiment, the present system defines several types of terminals, including a voltage terminal (which may be a traditional type), a resistor terminal, a current terminal (which may be idealized), and a transform-enabled terminal (intermediate structure). A current terminal may be approximated by a resistor terminal. A transform-enabled terminal may become either a voltage or a resistor terminal, depending on the structure of the terminal and the implementation of the resistance extractor. The terminals may have one or more of the following properties: resistivity (sheet resistance for 2D structures); direction; model squares; transform-enabled (Boolean value: true or false); ignored resistance; I/O type; external resistance. Whether a terminal is a voltage terminal, resistor terminal, or transform-enabled terminal depends on properties of the terminal.

The traditional terminal is the voltage terminal (vTerm), which represents a Dirichlet boundary condition, where the voltage at the terminal is a constant value. A voltage terminal may be inside a resistor structure, or on an edge. In some embodiments, a voltage terminal takes precedence over any resistive material at the same location, and the Dirichlet boundary condition imposed by the terminal takes precedence over the reflecting boundary condition along the edges of the resistor structure.

FIG. 3 illustrates an exemplary resistor structure, matching FIG. 2, showing three voltage terminals in accordance with some embodiments. Though the Dirichlet boundary condition is traditionally used for resistance extraction, a more accurate model can be achieved by using different boundary conditions, represented by other types of terminals. Non-traditional terminals may be more accurate in some embodiments because the terminal often represents an interface between the resistor structure under analysis and another resistor structure that has finite conductivity. A traditional (voltage) terminal, on the other hand, represents the contact as a superconductor (which has infinite conductance, which is the same as zero resistance).

Because a voltage terminal imposes a boundary condition at the interface with a resistor structure, a 3D terminal may be defined by a box with zero thickness; and, a 2D terminal may be defined by a rectangle with zero width.

FIGS. 4A-4D show examples of equivalent configurations for a voltage terminal in accordance with some embodiments. The voltage terminals shown in FIGS. 4A-4D are equivalent, imposing a boundary condition on the left edge of the resistor. For other terminal types described in the context of other embodiments, terminals are not equivalent because the effective model includes resistive material at the height of the terminal, extending left.

In some embodiments, voltage terminals are complex. FIGS. 5A-5E illustrate examples of various voltage terminal configurations in accordance with some embodiments. As illustrated in FIGS. 5A-5E, a voltage terminal may have a complex shape, a shape enclosed by the resistor structure, or a shape straddling the resistor structure.

A resistor terminal (rTerm) may be represented as a physical structure consisting of an (implied) resistor between the defined resistor structure at one end and a voltage terminal at the other end. The length may be defined explicitly or implied by an aspect ratio (e.g., as a fixed ratio between the length and the size of the contact at the surface of the resistor structure).

FIGS. 6A and 6B shows an exemplary 2D structure with three resistance terminals and corresponding implied structure in accordance with some embodiments. FIG. 6A shows the actual structure, with the grey representing resistor terminals (rTerm). FIG. 6B shows the implied structure, in which each rTerm has an associated voltage terminal (shown in black). This is implied by the resistor-terminal model, not part of the defined resistor structure.

Each rTerm has an implied direction away from the resistance structure, indicated by an arrow (FIG. 6A). Two rTerms have an explicit sheet resistance, as noted, that can be different from that of the defined resistor structure. The resistor terminals may be implemented by adding external resistors (resistor stubs) and associated vTerms, as shown in the implied structure on the right (FIG. 6B). After extracting resistance, the resistance of the associated resistor stubs (the ignored-resistance values of the vTerms as noted in the implied structure) may be subtracted out, recognizing that the added material is not part of the resistor structure as originally defined.

In some embodiments, an rTerm has a resistivity property, which may be a sheet resistance for 2D structures. This resistivity may not be defined for other types of terminals. The resistivity may have a value of zero, in which case the resistivity is inherited from the region where the resistor structure contacts the structure. In FIG. 6A, two of the rTerms have a specified sheet resistance of 3 $\Omega/\mu m$, not inherited from the defined resistor structure.

In some embodiments, a current or resistor terminal is only defined by a single box (3D) or rectangle (2D) with a defined direction (+x, −x, +y, −y, +z, or −z) that indicates the reference direction of the associated virtual resistor. If not explicitly specified, the direction of the virtual resistor is then perpendicular to (and away from) the resistor structure when the terminal box is flush with the resistor structure on exactly one side.

In some embodiments, a model squares parameter defines an aspect ratio controlling the size of implied resistor. Other implementation methods are possible. When the interface between an rTerm and the resistor structure exactly covers one end of a resistor, the defined resistor contributes to the 1D nature, and, in some embodiments, an implied (virtual) resistor is added only if the 1D resistor-structure shape that is part of the defined resistor structure is not long enough to be considered 1D in nature.

FIGS. 7A-7E illustrate exemplary resistance terminal structures and associated implementations with a model-squares parameter defining an aspect ratio of 1/2. The upper one of each drawing pair shows the defined rTerm structures and the bottom illustration shows exemplary associated implementations. The model-squares parameter defines an aspect ratio of 1/2. FIGS. 7A-7E show the size of the resulting resistor stub (½ square). For the two cases on the left (FIGS. 7A and 7B), the defined resistor structure satisfies the 1D expectation of current, so no additional resistor need be generated. An implementation option not shown here uses model-squares to control the thickness only when the resistor terminal has no thickness and uses the rectangle (box for 3D) as the implied resistor whenever the terminal does have thickness.

In some embodiments, an implementation of an rTerm must meet all or a subset of the following conditions to avoid triggering an error: (1) the rTerm structure is a single box (3D) or rectangle (2D); (2) the direction is specified, or unambiguously implied by its relationship to the resistor structure; (3) the resistivity (sheet resistance for 2D structures) is specified, or unambiguously implied by the resistor structure. FIGS. 8A-8C illustrate examples of resistance structures that trigger errors.

A current terminal (iTerm) is a conceptual terminal rather than an implemented boundary condition. It is equivalent to a resistor terminal with an implied (virtual) resistor that is infinitely long. In some embodiments, the iTerm is a region flush with an external plane of the resistor structure and has an effective resistivity (sheet resistance for 2D structures). The effective resistivity may be explicitly defined, or it may be implied by the resistivity of the resistor structure at the contact region. Current flows out of a contact region into an associated virtual uniform-resistance structure (infinite length) in a direction implied by the terminal. The current in a virtual resistor approaches a uniform distribution farther away from the resistor structure.

FIGS. 9A and 9B shows an exemplary 2D resistor structure with three current terminals in accordance with some embodiments. FIG. 9A illustrates the structure with current terminals, and FIG. 9B shows the implied structure. Each iTerm, shown in black, has an implied direction away from the resistance structure, indicated by an arrow. Two iTerms have an explicit sheet resistance, as noted, different from that of the defined resistor structure. FIG. 9B shows the implied external resistors. The darker grey regions are implied by the current-terminal model, not part of the defined resistor structure A current terminal may be modeled by an rTerm, described previously. The rTerm solution quickly approaches the iTerm solution as the rTerm length is increased.

FIGS. 10A-10C illustrate an exemplary current terminal structure and the errors of associated resistance terminals in accordance with some embodiments. For the test case shown in FIGS. 10A-10C, an rTerm model with an aspect ratio of 1/2 (the default) has an error of approximately 0.2% compared to the iTerm solution. For an aspect ratio of 1, the error is approximately 0.01%.

In some embodiments, a transform-enabled terminal (xTerm) is a defined voltage terminal that is automatically changed to a resistance terminal when it meets all conditions required of an rTerm with an implied direction and an implied resistance. The conditions are: (1) the terminal must be a single box (3D) or rectangle (2D); (2) the direction must be unambiguously implied by its relationship to the resistor structure; and (3) the resistance must be unambiguously implied by the resistor structure. FIGS. 11A-11C illustrate an exemplary transition-enabled terminal requiring voltage terminal representation in accordance with some embodiments. FIGS. 11A-11C illustrates xTerms that do not meet the conditions (1)-(3) specified above, so they are represented as vTerms, not as rTerms.

In addition, in some embodiments, an xTerm is designated transform enabled (a Boolean-flag property, discussed below), does not include any property implying a resistor terminal (resistivity or direction, discussed below) or a property implying a voltage terminal (ignored resistance, discussed below).

Transform-enabled structures may be supported in some embodiments, recognizing that to extract 2D or 3D resistance, a complex resistor structure is often partitioned by clipping at convenient locations such as at the edge of a wire suited for 1D analysis, partway into a uniform wire, or at the stem of a T intersection of two connecting shapes. FIG. 12 illustrates exemplary convenient locations at which a 2D resistor structure may be partitioned in accordance with some embodiments. In general, contacts (between partitions) are better represented by the rTerm model than by the vTerm model. At the same time, because partition boundaries may not have attributes consistent with rTerms, a vTerm model may be acceptable when an rTerm model is not possible.

The model squares parameter defines an aspect ratio controlling the size of an implied resistor if the xTerm is transformed to an rTerm. The resistance and direction are implied by the resistor structure.

In some embodiments, defining a resistivity (positive or zero) forces a terminal to be interpreted as an rTerm. The resistivity of an rTerm is the resistivity of the implied (virtual) resistor. A terminal may have either a specified resistivity (which indicates an rTerm) or an ignored resistance value (which indicates a vTerm). For a specified resistivity of zero, the value implied by the resistivity in the region where the terminal touches the resistor structure may be found.

In some embodiments, defining a direction (+x, −x, +y, −y, +z, or −z) forces a terminal to be interpreted as an rTerm. The direction indicates the direction away from the resistor structure. A terminal may have a specified direction (which indicates an rTerm) or an ignored resistance value (which indicates a vTerm).

FIGS. 13A-13C illustrate resistance terminals requiring specified directions in accordance with some embodiments. Specifying the direction may be useful in some configurations, such as those illustrated in FIGS. 13A-13C, where the implied direction (based on terminal edges flush with the resistor structure) is incorrect, ambiguous, or unavailable. Even though it has no resistor structure, the example on the right (FIG. 13C) is a valid structure for extracting a "correction" resistor that can be used to augment a 1D resistance network. Another example is shown in FIG. 14, discussed below.

In some embodiments, the model squares parameter specifies the aspect ratio for the virtual resistor implied by an rTerm. The aspect ratio is the length of the resistor (in the specified or implied rTerm direction) divided by the larger dimension of the cross-section (3D) or simply divided by the other dimension (2D). As discussed below in the explanation of block 130 of FIG. 1, the value of this model-squares parameter may be used at the end of the input phase to decide where to insert virtual terminals when adding features to the resistor structure.

In some embodiments, the transform-enabled Boolean property (true or false) of a terminal determines whether it is an xTerm. An xTerm has neither a resistivity (which indicates an rTerm), nor a direction (which also indicates an rTerm), nor an ignored resistance (which indicates a vTerm). In some embodiments, an xTerm is transformed either to an rTerm (if it conforms to requirements for an rTerm) or to a vTerm (otherwise), without error.

Defining a value of ignored resistance (positive or zero) may force a terminal to be interpreted as a vTerm. In some embodiments, a terminal cannot have an ignored resistance value even of zero (which indicates a vTerm) with a specified resistance or direction (which indicates an rTerm). In some embodiments, an ignored-resistance value associated with each terminal is removed from reported values using the method described below in the context of FIG. 34.

FIGS. 14A-14C illustrate examples of using ignored resistance to find resistance correction in accordance with some embodiments. In the example in FIGS. 14A-14C, ignored resistance is used to find the resistance correction to a 1D solution of the resistance between two terminals. Whether the entire resistance is ignored (middle, FIG. 14B), or only the resistance on the clipped structure is ignored (right, FIG. 14C), it indicates the same correction of −0.8Ω.

The concept of ignored resistance for voltage terminals (or, equivalently, the novel resistor-terminal type) allows the extraction of resistor networks that are then inserted into existing 1D resistor networks to give accurate resistance models without the need to change the 1D resistors.

Figure 15:
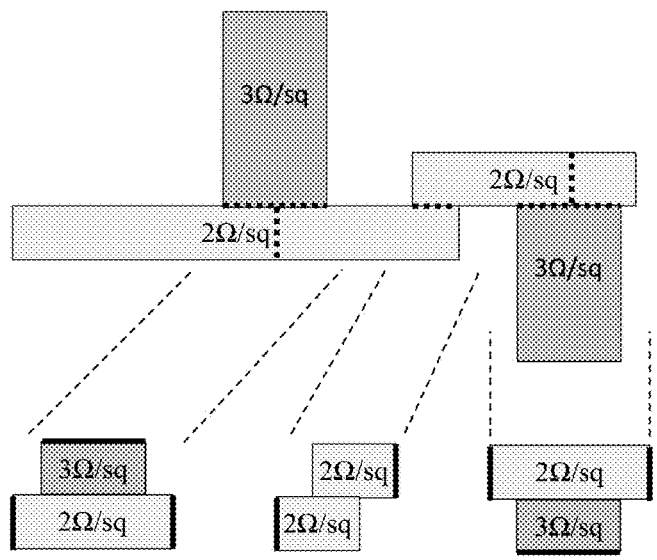
FIG. 15 illustrates an example of a structure of a 1D resistor network having partitions and correction structures in accordance with some embodiments.

FIG. 15 illustrates an exemplary structure for a 1D resistor network showing 1D partitions (top) and "correction" structures (bottom). The structure for a 1D resistor network shows 1D partitions (top) and "correction" structures (bottom). In each partitioned structure in the example in FIG. 15, the ignored resistance matches the 1D resistance for the same structure. The number of 1D resistors at a node in the 1D network (two to three, in this example) matches the number of terminals in the associated resistor structure partitioned for 2D analysis. The extracted networks may be inserted between resistors in the original network, each terminal connecting to a 1D resistor.

Figure 16A:
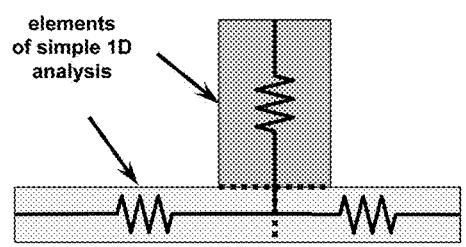
FIGS. 16A-16C illustrate augmenting a 1D network in accordance with some embodiments.
Figure 16B:
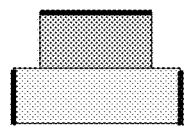
Figure 16C:
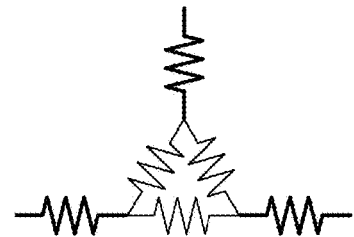

FIGS. 16A-16C show how a 1D network can be augmented as a 1D resistor network corresponding to the left T-intersection of FIG. 15. For the network of FIG. 16A resulting from simple 1D analysis, a 2D resistor structure in FIG. 16B is used to calculate corrections, resulting in the high-accuracy augmented network of FIG. 16C. In the 2D structure, all 1D-based resistance values are accounted for by ignored-resistance values associated with the terminals. This approach avoids any need to move capacitance elements associated with a 1D resistor. In general, 1D resistance models overestimate resistance and correction values are negative.

Figure 17:
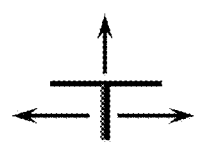
FIG. 17 illustrates an exemplary resistor structure having three resistance terminals equivalent to the 2D resistor structure illustrated in FIG. 16, in accordance with some embodiments.

FIG. 17 shows an exemplary resistor structure that is equivalent to the 2D resistor structure of FIG. 16B. The structure of FIG. 17 has three rTerms. As shown in FIG. 17, a resistance terminal can be used in place of a voltage terminal with ignored resistance and its associated (ignored) resistor structure, yielding identical results. This structure consists only of three resistance terminals and includes no resistor material. All resistor material is implied by the rTerms.

In some embodiments, a terminal may be designated as a driver and (independently) as a receiver. The purpose of designated an I/O type is to allow an implementation to ignore convergence criteria involving the P2P resistance between two terminals that are both defined as receivers when neither is defined as a driver.

A terminal-dependent external resistance value may be used to relax convergence criteria. In some embodiments, a value of zero is accepted. For an rTerm with no specified value of external resistance (neither positive nor zero), the external resistance is the same as the resistance of the implied resistor stub.

Returning to FIG. 1, at block 130, features are added. After inputting data and before converting the data to an efficient internal form, the system in some embodiments creates or modifies terminals so that all internal representations are effectively voltage terminals. To speed convergence, in some embodiments the system inserts virtual terminals where appropriate. Then it replaces each resistance terminal by the implied resistor structure and defines a voltage terminal with an appropriate value of ignored resistance, in some embodiments. Finally, in some embodiments, it transforms any suitable transform-enabled terminal into a resistance terminal. In some embodiments, it transforms the terminal into the implied resistor structure and a voltage terminal with ignored resistance.

In some embodiments, the resistance extractor inserts pairs of voltage terminals perpendicular to the direction of the current flow at locations where it can determine that the current is essentially 1D (no transverse current component). The model-squares parameter, described above, allows the user to control the level of approximation creating virtual terminals. In some embodiments, the resistance extractor requires a uniform stretch of resistor with an aspect ratio of at least the value of the model squares parameter, as defined at the end of the input phase. (An implementation may allow the model squares parameter to be redefined throughout the input file, in which case any rTerm or xTerm uses the value that is defined when the terminal is first defined.) The aspect ratio is the dimension in the direction of the 1D current, divided by the transverse dimension (in 3D; the resistance extractor uses the larger of the two transverse dimensions in some embodiments).

In some embodiments, the resistance extractor places a virtual terminal so the distance to the nearest end of the resistor block results in an aspect ratio that is half of the model squares value. For example, with a model-squares value of 1 (the default value) and a resistor block with a transverse cross section of 3 um by 4 um, the virtual terminal will be 2 um from the edge (in 3D; the resistance extractor uses the larger of the two transverse dimensions in some embodiments). The model-squares value corresponds to the aspect ratio of shortest uniform section that can include virtual terminals. In this 3 um-by-4 um example, the resistance extractor may only be able to insert a virtual terminal if the block is longer than 4 um.

FIG. 18 shows an example of virtual terminals inserted for a dimension H parallel to the 1D current direction, and a transverse dimension of W. In some embodiments, as a prerequisite for the resistance extractor to create virtual terminals, H/W must be larger than the model-squares value. The resistance extractor also calculates the resistance between the pair of inserted virtual terminals using a simple 1D formula, accurate for this configuration of virtual terminals. In the example of FIG. 18, this resistance value is 3Ω*H'/W. This calculation avoids the need for random-walk sampling between any pair of virtual terminals. In some embodiments, virtual terminals are not seen by the user. The resistance extractor reduces its internal resistance network to eliminate the nodes corresponding to virtual terminals, as described below in the discussion of block 166 of FIG. 1. Eliminating nodes can be referred to in some embodiments as eliminating a linear parameter, where a linear parameter is a parameter that is linear, such as K1 and K2, but not K3, in the following expression: K1 *x^2+K2 *x*y+(K3 *y)^2.

In some embodiments, after the input phase has completed, the resistance extractor replaces any resistance terminal by a voltage terminal at the end of any implied resistor stub. The resistor stub has the resistivity assigned to the terminal, and a length such that the aspect ratio matches the model-squares property of the terminal. In the case that an added resistor stub would merely extend a stub of the defined resistor structure, the resistance extractor extends that stub instead, but only if necessary to achieve a length matching the model-squares value of the terminal. The voltage terminal generated has an ignored-resistance value that matches the resistance of any added resistor. If the resistor terminal has no specified external-resistance value, the resistance extractor uses a value equal to the ignored-resistance value.

FIGS. 19A and 19B illustrate exemplary defined resistance terminal structures and their associated voltage terminal representations in accordance with some embodiments. FIGS. 19A and 19B show examples where the rTerm is merely replaced by a vTerm. In other words, the implied resistor is represented by the defined resistor structure, because it already conforms to the shape of an rTerm. For this simple replacement, the sheet resistance of the rTerm is zero or matches the implied sheet resistance (2Ω/□). Adding a resistor block and then ignoring its resistance would have virtually no effect on results. This condition is not strictly necessary. Alternate behavior can be supported.

FIG. 20 illustrates an exemplary defined resistance terminal structure and an associated partial implementation in accordance with some embodiments. FIG. 20 shows an example where some of the defined resistor structure is part of the "1D" resistor stub. The defined rTerm structure is shown in the top of the figure, and the associated "partial" implementation is shown on the bottom. The original defined resistor partly accounts for 1D effects. The defined resistor structure already conforms to the shape of an rTerm. Adding a longer resistor block and then ignoring its resistance would have virtually no effect on results.

FIGS. 21A-21C show examples of defined rTerm structures (top) and associated implementations (bottom), with the size determined by the model squares value. In the examples of FIGS. 21A-21C, the implied resistor does not include any of the defined resistor structure. As shown in the FIGS. 21A and 21B, the height of the implied resistor, implied by the size of the rTerm, is not necessarily the same as the size of the contact region. In the example on the right, the original defined resistor structure is not used as the implied resistor because it has a different resistance.

In some embodiments, after the input phase has completed, the resistance extractor also transforms all xTerms. If an xTerm is valid as an rTerm that has an implied resistance and implied direction as discussed previously, the resistance extractor treats the xTerm as an rTerm and then replaces it by a vTerm and resistor stub as described previously. In some embodiments, the resistance extractor considers as a vTerm any xTerm that is not valid as an rTerm (see FIGS. 11A-11C for examples).

Returning to FIG. 1, at block 140, the data is polished, in some embodiments. After all input data has been processed, the internal structures consist of voltage terminals and resistors. The system in some embodiments reduces the resistor structure to an intermediate representation, generates calculation surfaces for each terminal, and creates an internal form of the data that is more efficient for random-walk extraction of resistance. In some embodiments, the internal form for the data includes: reflection planes, transition planes, edges, and points, and concave edges and points.

In some embodiments, the resistance extractor removes any overlap between resistors. In some such embodiments, a resistor box (rectangle for 2D) takes precedence over any defined earlier, though this application of precedence can be easily changed. Removing the overlap facilitates generation of other data.

In some embodiments, the resistance extractor recognizes a traditional flux-based integration surface and a novel voltage-based surface. As used herein, an "integration surface" is a surface along which one performs an integration, whereas a "calculation surface" is more general. As explained below, the flux-based integration surface approach does an integration, whereas the voltage approach simply calculates an average.

A flux based integration surface (E-field based) may be required for a more complex configuration of a terminal. Generation of a flux-based integration surface may be similar integration surfaces with capacitance extraction, except that the surface only needs to be maintained within the local resistor structure. The resistance extractor may need to generate flux-based integration surfaces when a layout includes multiple complex terminal configurations that are not separated by virtual terminals. The complete conductance matrix can still be extracted for a structure containing multiple complex terminals (without associated integration surfaces) when each is isolated from other terminals by virtual terminals. For example, FIG. 22 illustrates an exemplary resistor structure with two complex terminals in accordance with some embodiments.

When an integration surface bisects a uniform section of resistor, it may be replaced by a pair of average-voltage based calculation surfaces, as described below. In some embodiments, where possible, the resistance extractor uses average-voltage based calculation surfaces rather than the more traditional (and more general) flux-based integration surfaces. The simplest suitable structure for this is a resistor stub terminating on a terminal, i.e., the same structure generated by a resistor terminal, as shown in FIG. 23. FIG. 23 illustrates an exemplary average-voltage-based calculation surface (dotted) for an rTerm-based structure.

The 1D resistance $R_A$ bounded by terminal A and its associated calculation surface is easily calculated. The conductance element (in the conductance matrix) associated with the source terminal A and with another terminal B is $g_{AB}=P_{AB}/R_A$, where $P_{AB}$ is the probability that a random walk starting on the calculation surface ends on terminal B. The starting points of the walks from the calculation surface are distributed uniformly. Because the weight is constant, using an average-voltage based calculation surface, compared to using a flux-based integration surface, may result in significantly faster convergence.

Figure 24:
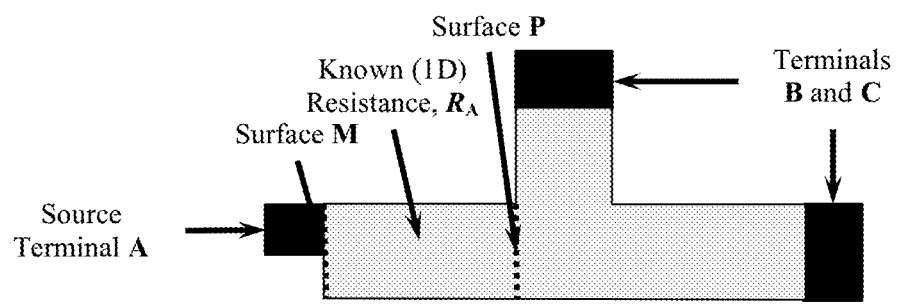
FIG. 24 illustrates an exemplary average-voltage-based integration surface for an exemplary non-resistance-terminal-based geometry in accordance with some embodiments.

A variation that expands the application of average-voltage-based calculation surfaces uses two calculation surfaces and is shown in the example of FIG. 24, which illustrates an exemplary average-voltage-based integration surface for an exemplary non-resistance-terminal-based geometry in accordance with some embodiments.

The 1D resistance $R_A$ bounded by the two calculation surfaces is easily calculated. The conductance element (in the conductance matrix) associated with the source terminal A and another terminal B is $g_{AB}=P_{AB}/R_A-M_{AB}/R_A$, where $P_{AB}$ is the probability that a random walk starting on the calculation surface P (farthest from the source terminal) ends on terminal B, and $M_{AB}$ is the probability that a random walk starting on the calculation surface M (at the source terminal) ends on terminal B. The starting points of the walks from each calculation surface are distributed uniformly. Walks starting where surface M touches terminal A end immediately on terminal A. In some embodiments, the resistance extractor clips surface M so that only those walks that have some chance of hitting a different terminal are executed.

In some embodiments, the resistance extractor finds voltage-based integration surfaces for each terminal, where possible. Otherwise, it uses a more traditional E-field-based integration surface as described previously.

Figure 25:
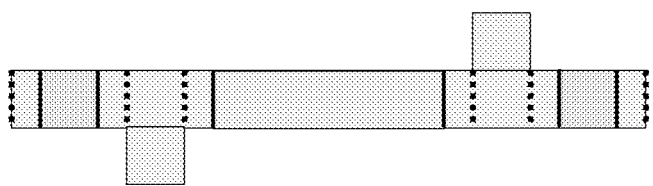
FIG. 25 illustrates three exemplary virtual-terminal pairs and associated integration surfaces in an exemplary uniform resistor structure in accordance with some embodiments.

In some embodiments, a virtual terminal also uses an average-voltage based calculation surface. The surface associated with a virtual terminal is at the nearest end of the uniform section used to generate the associated pair of virtual terminals. FIG. 25 illustrates three virtual-terminal pairs (solid) and associated integration surfaces (dotted) in a uniform resistor structure. The lightly shaded regions have 1D resistance values and are not sampled in some embodiments.

The internal representation of a resistor structure is novel. Instead of data structures that describe blocks of resistive material, the resistance extractor represents the interfaces between different blocks by transition structures. The outside of the resistor structure and the interface between materials with different resistivity are represented by reflection planes, transition data structures, and concave data structures, as described below.

Figure 26:
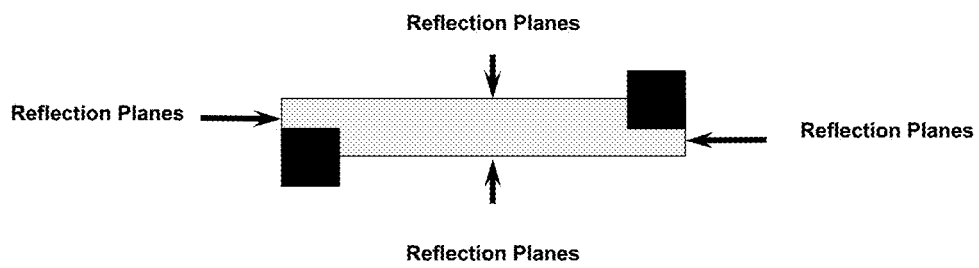
FIG. 26 illustrates reflection planes of an exemplary simple 2D resistance structure in accordance with some embodiments.

While all materials have resistivity, including insulators outside of a resistor structure, the range is quite large. Copper, often used in metallization, has a resistivity of about $2 \times 10^{-8}$ Ω-m. Silicon dioxide, a commonly used insulator, has a resistivity of about $10^{17}$ Ω-m, almost 25 orders of magnitude higher. Because of this large range of resistivity, the resistivity outside the resistor structure compared to the resistivity inside is essentially infinite (zero conductivity), allowing the outside edges of a resistor structure to be accurately modeled by reflective boundary conditions. (The Dirichlet boundary condition imposed at a voltage terminal takes precedence.) In some embodiments, the resistance extractor finds and stores the boundary of the resistor structure as reflection planes separately in each of the six Manhattan directions (+x, −x, +y, −y, +z, and −z). The resistance extractor may then use these planes to find relevant reflective boundaries near a hop location of a random walk and then apply the reflection after the hop, as discussed below. FIG. 26 illustrates exemplary reflection planes for a simple 2D resistance structure. FIG. 26 shows ±x and ±y reflection planes in a 2D structure. A 3D structure includes ±z reflection planes.

In some embodiments, the resistance extractor represents the interface at the transition between different resistivity regions by three types of transition planes (xy, xz, and yz), by three types of transition edges (x, y, and z), and by transition points. A 2D structure has only xz and yz transition planes (effectively 2D x and y transition edges), and z transition edges (effectively 2D transition points). FIG. 27 shows transition edges and planes for an xy cross-section of a 3D resistor structure. A transition plane includes hop data involving the two perpendicular directions: ±z for xy planes, ±y for xz planes, and ±x for yz planes. A transition edge includes hop data involving the four associated quadrants: (±y,±z) for x edges, (±x,±z) for y edges, and (±x,±y) for z edges. A transition point includes hop data involving the eight associated octants: (±x,±y,±z). The hop data depends on the resistivity in each direction. When a walk hits a transition structure, the local resistivity is already incorporated into the hop data, minimizing the effort required to select a hop destination. Transition planes happen to be bounded by transition edges, and transition edges (in 3D resistor structures) happen to be bounded by transition points.

In some embodiments, the resistance extractor also maintains concave structures (transition structures that involve the resistor boundary and a uniform resistance value) as three types of concave edges (x, y, and z), and as concave points. A 2D structure has only z concave edges (effectively 2D concave points). A concave structure can be considered a type of transition structure, but with simpler data. A concave edge includes quadrant-related hop data: (±y,±z) for x edges, (±x,±z) for y edges, and (±x,±y) for z edges. A concave point may include octant-related hop data: (±x,±y, ±z). An example of a concave edge is shown in FIG. 28, which shows a concave edge in a resistor structure, where the data structure includes data excluding the +x, −y quadrant. In a 3D resistor structure, a concave edge happens to be bounded by concave points.

Returning to FIG. 1, at block 150, the walks are initialized. In some embodiments, walk initialization involves pre-calculation of data related to a general Manhattan-based random walk (cubes for 3D, and squares for 2D) and initialization of a random number generator to support randomized extraction or seeded (reproducible) extraction results, depending on whether the command line specifies seeded extraction. In some embodiments, when accessed through an Application Programming Interface (API) the pre-calculation is only performed once, even when the system API is used to analyze several independent structures.

At block 160, the walks are performed. In some embodiments, the resistance extractor performs a calculation cycle in a loop. In the loop, a number of walks is allocated and performed, the results are evaluated, and a decision is made regarding whether the loop needs to be repeated. FIG. 1 illustrates the process of performing walks in accordance with some embodiments. At block 162, walks are allocated. In some embodiments, the number of walks allocated may be based on the speed of the walks, convergence, and the number of seconds until the next report (allowing the system to provide the user with periodic reports about its progress). In some embodiments, the system allocates walks to terminals and then, for each terminal, either to the associated calculation surfaces (for a terminal supporting average-based walks) or to the associated integration surfaces (for a terminal supporting flux-based walks).

At block 164, walks are performed. In some embodiments, each random walk starts at a point randomly selected on a calculation surface of a source terminal. Each subsequent hop then changes the coordinates until it hits a destination terminal. A single random walk provides an estimate (a statistical sample) of the column of the conductance matrix associated with the source terminal. The estimate associated with the destination terminal is the weight of the walk. The estimates associated with other terminals are zero. After a number of walks from the same terminal, the system can calculate the average and statistical error (also called normal error) for the associated column of the conductance matrix.

In some embodiments, the walk weights for average-based walks and flux-based walks are different. For average-based walks, all walks for a given plane have the same weight, so the first hop is the same as all subsequent hops. For flux-based walk, the weight of a walk depends on the first hop. The weight can vary substantially, depending on the relationship between the integration surface and objects that limit the size of the hop (transition structures, concave structures, and terminals). The weight is inversely proportional to the size of the first hop. As a result, the convergence speed can be greatly impacted for certain structures because of the variance of the weight. In some embodiments, the first hop is similar to subsequent hops except for the following: (1) the weight is calculated as a function of the resistivity, the hop direction, and the hop size; (2) the hop probabilities depend on the orientation of the integration surface (plane); (3) a hop size of 0 (zero) indicates an error because the integration surface should not touch any terminal.

In some embodiments, the method of considering reflective boundary conditions within the random-walk kernel disclosed herein considers local reflecting boundaries when searching for objects that limit the size of the hop, and then it reflects the destination coordinates inside the resistor structure as necessary. FIGS. 29A-29C illustrate examples to show how reflection hops increase the hop distance.

As illustrated in FIGS. 29A-29C, accounting for locally reflective boundaries allows larger hops without introducing any error. The local environment is the environment inside the square (cube for 3D) that defines the possible hop destinations. The number of hops, and therefore the time of a walk, decreases with the square of the hop size. Increasing the average hop size by 2× gives a runtime improvement of 4×.

In some embodiments, the first step in calculating a hop is to allow the hop to move to a nearby corner (e.g., a transition or concave edge or point). This is an approximation, but typically a small one that is only applied when a hop location is within corner resolution of a corner. This method avoids problems such as accidentally hopping out of the resistor structure.

In some embodiments, the next step in calculating a hop is to find reflecting planes in each of the six Manhattan directions from the hop location (four Manhattan directions for 2D structures). FIGS. 30A and 30B illustrate exemplary reflection boxes determined by the nearest reflecting edge in each Manhattan direction in accordance with some embodiments.

In some embodiments, the size of a hop is limited only by those transition structures, concave structures, and terminals that are on or inside the reflection box. FIGS. 31A and 31B illustrate examples of objects affecting the size of a hop in accordance with some embodiments. As discussed below, a transition or concave structure at the hop location does not affect the hop size, but does affect the hop direction. Objects outside the reflection box do not affect hop size.

A transition data structure may define the interface between materials with different resistivity (sheet resistances for 2D structures) and can involve the outside edge of the resistor structure. A concave data structure involves the outside edge of the resistor structure and uniform resistance material. Though a transition or concave structure at the hop point does not affect the hop size, data in the transition or concave structure probabilistically affects the direction of the hop. In some embodiments, transition structures take precedence over concave structures; transition points take precedence over transition edges, which take precedent over transition planes; and concave points take precedence over concave edges.

In some embodiments, when hopping from a transition structure, the resistance extractor uses data associated with the transition structure to select the hop destination. This data accounts for the resistivity in each octant (quadrant).

FIGS. 32A and 32B shows exemplary transition structures in a cross-section of a 3D resistor structure, and in an equivalent 2D resistor structure. In 2D, an xz or yz transition plane can be considered to be an x or y transition edge; while, an x transition edge can be considered to be a 2D transition point.

In the examples of FIGS. 32A and 32B, when the starting hop point is at any of the z transition edges, the xy quadrant is selected based on data stored with the transition structure. The probability of hopping to a quadrant outside the resistor structure is zero. The other probabilities depend on the resistivity (3D) or sheet resistance (2D) of the quadrants. When the starting hop point is on the xz transition plane, data in the transition structure indicates how often to hop in the +y direction or the −y direction. When the hop point is on the yz transition plane, data in the transition structure indicates how often to hop in the +x direction or the −x direction. In some embodiments, the random-walk kernel does not need to determine resistance values because all relevant resistance information has been converted to data stored in the transition structures.

Figure 33A:
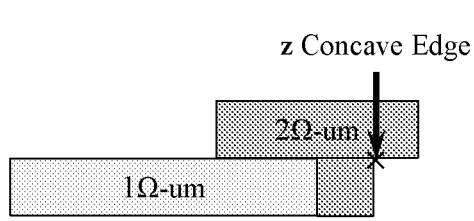
FIGS. 33A and 33B illustrate exemplary 3D and 2D resistor structures with equivalent concave data structures in accordance with some embodiments.
Figure 33B:
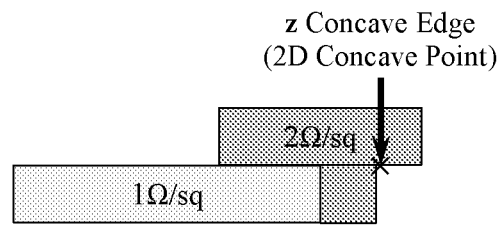

In some embodiments, concave data structures (edges and points) are similar to transition data structures, but only involve the interface between material with a single resistivity and the boundary of the resistor structure. The associated data indicates which octants (for points) or quadrants (for edges) are inside the structure. FIGS. 33A and 33B illustrate exemplary 3D and 2D resistor structures with equivalent concave data structures in accordance with some embodiments. For the examples in FIGS. 33A and 33B, a hop from the z concave edge is into one of the three interior octants.

In some embodiments, to complete a hop, the reflection box found at the beginning of the hop (described above) is used to reflect the hop back into the resistor structure. When the hop coordinate x is larger than the maximum x value of the reflection box ($x^+$), it is replaced by $2x^+-x$. When the hop coordinate x is smaller than the minimum x value of the reflection box (x), it is replaced by $2x^--x$. Operations for coordinates y and z are analogous.

In some embodiments, the hops continue until the calculated hop size is zero, which only occurs when the hop is at a terminal because no reflecting, transition, or concave structures can generate a hop size of zero. At the end of a walk, the associated weight is allocated to the end terminal. The weight of a walk from terminal A to B is a single statistical sample of the associated conductance-matrix element, $g_{AB}$. At the same time, 0 (zero) is single statistical sample of other conductance-matrix elements ($g_{AC}$, $g_{AD}$, . . . ) associated with terminal A. The weight of a walk is determined at the start of the walk as described above.

Referring again to FIG. 1, at block 166, the results are calculated. In some embodiments, the resistance extractor processes the raw statistical data to generate an internal conductance matrix, with a matrix of associated statistical errors. The raw statistical data for $g_{AB}$ consists of the sum of walk weights (statistical samples of $g_{AB}$), the sum of the square of the walk weights (statistical samples of $g_{AB}^2$) and the number of samples. This is enough data to calculate the average and the standard error (statistical error) for $g_{AB}$. In some embodiments, after calculating the individual matrix elements, the resistance extractor replaces $g_{AB}$ and $g_{BA}$ by an average of the two results.

In some embodiments, the resistance extractor then includes the 1D conductance value associated with a pair of virtual terminals. This accounts for the resistance between the two terminals. This does not impact the absolute statistical error for any parallel (extracted) conductance between the two terminals. The relative statistical error decreases, however, since the conductance increases.

The result is a complete conductance matrix that still includes rows and columns for virtual terminals, and does not yet account for ignored resistance (due to explicitly ignored resistance of vTerms, or implicitly ignored resistance of rTerms and of xTerms that have been transformed to rTerms). Subsequent reduction may eliminate rows and columns associates with virtual terminals and account for resistance to be ignored.

In some embodiments, a resistor matrix is then calculated, and a resistor element $r_{ab}$ is $1/g_{ab}$ (initial conductance-matrix values happen to be positive, not negative). The relative statistical error of $r_{ab}$ is taken to be the same as for $g_{ab}$. This is not accurate when the relative statistic error is large, but by the time results have converged to user-defined goals, the relative statistical errors are small. The resistor matrix accounts for ignored resistance and does not include rows or columns associated with any virtual terminals (inserted by the resistance extractor).

Figure 34A:
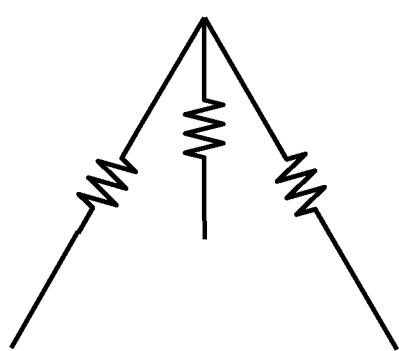
FIGS. 34A and 34B illustrate how to account for ignored resistance in accordance with some embodiments.
Figure 34B:
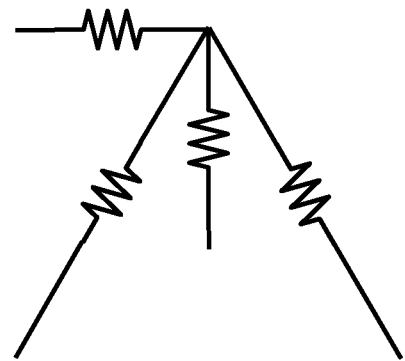

In some embodiments, any ignored resistance is removed. For example, for a two-terminal structure, the ignored resistance of the two terminals is simply subtracted from the resistance value. For more than two terminals, the resistance extractor may remove the ignored resistance by inserting a resistor (between a terminal and its node) that is a negative resistance equal to the amount of resistance to be ignored for that terminal. FIGS. 34A and 34B illustrate how to account for ignored resistance in accordance with some embodiments. In some embodiments, the resistance extractor removes ignored resistance for all terminals, and eliminates the new node in each case. In addition, the resistance extractor may track how the statistical error gets modified by such a change.

In some embodiments, the resistance extractor also removes the node associated with any virtual terminal using the same circuit-reduction method it uses for removing ignored resistance.

In some embodiments, the resistance extractor then derives a reduced conductance matrix from the resistance matrix, where a conductance element $g_{ab}$ is $-1/r_{ab}$. A value on the diagonal is the negated sum of the row (or column) of the conductance matrix. Unlike the internal matrix described above, the reduced conductance matrix does not include rows and columns corresponding to virtual terminals, and conductance values include ignored-resistance compensation.

In some embodiments, the resistance extractor finds the P2P resistance between two terminals by starting with a copy of the resistor matrix and then eliminating all other nodes using conventional resistor-network reduction methods. The resulting resistor is the P2P resistance between the two terminals. The resistance extractor may perform this operation for each pair of terminals.

Figure 35A:
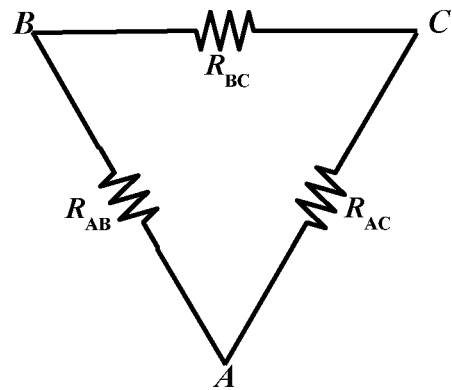
FIGS. 35A and 35B illustrate exemplary ∇ and Y networks.
Figure 35B:
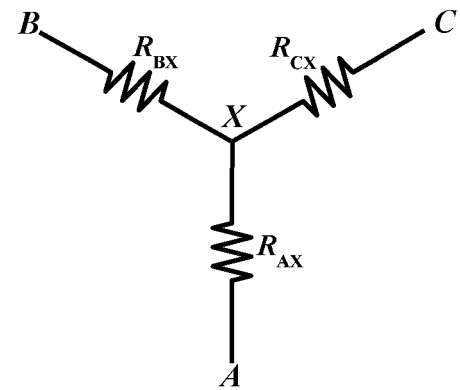

As a special case, when the network has exactly three terminals, in some embodiments the resistance extractor also generates resistor values for an equivalent Y network (three resistors connecting each terminal to a common node). The resistor-matrix form, on the other hand, defines a $\nabla$ network, consisting of a resistor between each pair of terminals. While a Y network includes an extra node, it does not include a resistance loop than can make subsequent resistance analysis of a net more difficult. FIGS. 35A and 35B illustrate exemplary $\nabla$ and Y networks.

Figure 36A:
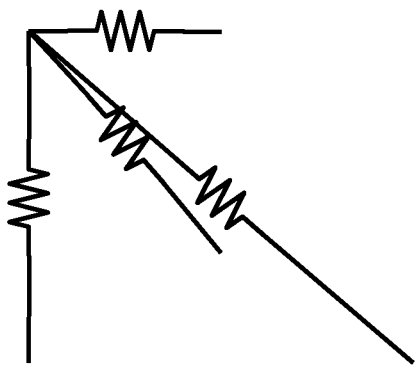
FIGS. 36A and 36B illustrate an exemplary resistance network before and after eliminating a node in accordance with some embodiments.
Figure 36B:
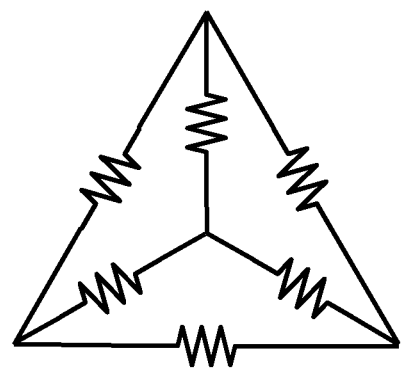

In some embodiments, the resistance extractor reduces the resistor network in order to account for ignored resistance, to eliminate virtual nodes from the reported results, and to find P2P resistance values. Resistance-network reduction may be accomplished in various ways. For example, in some embodiments, the resistance extractor does not use matrix operations. Instead, it eliminates any single node X that is connected to other nodes (A, B, C, D, etc.) by replacing the connecting resistors ($r_{XA}$, $r_{XB}$, $r_{XC}$, $r_{XD}$, etc.) by resistors connecting each pair of the other nodes ($r_{AB}$, $r_{AC}$, $r_{AD}$, $r_{BA}$, etc.). The value of $r_{AB}$ is $r_{XA} \times r_{XB} \times g_X$, where $g_X = 1/r_{XA} + 1/r_{XB} + 1/r_{XC} + 1/r_{XD} + \ldots$. Other new resistors involve similar equations. FIGS. 36A and 36B illustrate an exemplary resistance network before and after eliminating a node in accordance with some embodiments. FIGS. 36A and 36B show numeric results eliminating a node with four resistors. In this example, $g_X = 3/\Omega$, so $r_{AC}$ is $r_{XA} \times r_{XC} \times g_X = (1\Omega) \times (2\Omega) \times (3/\Omega) = 6\Omega$. In some embodiments, as the resistance extractor eliminates a node, it also tracks the statistical error, as described below.

A resistor generated when eliminating a node may connect two nodes that are already joined by a resistor. In this case, the resistance extractor may use the standard formula for finding the resistance of parallel resistors: $r_\| = r_A \times r_B/(r_A + r_B)$. In such embodiments, the resistance extractor may track the statistical error as it applies this formula, as described below.

In some embodiments, the resistance extractor tracks the statistical error as it reduces a node. The expanded formula for $r_{AB}$ is $r_{XA} + r_{XB} + r_{XA}r_{XB}/r_{XC} + r_{XA}r_{XB}/r_{XD} + \ldots$. The resistance extractor calculates the statistical error of this expression assuming the associated error for each resistor value ($r_{XA}$, $r_{XB}$, $r_{XC}$, $r_{XD}$, etc.) is independent. As such, the variance (square of the standard error) can be added independently for each resistor. The standard error (before squaring) associated with $r_{XA}$ in this expression is $\delta_{XA} \times (1 + r_{XB}/r_{XC} + r_{XB}/r_{XD} + \ldots) \to \delta_{XA} \times r_{XB} \times (1/r_{XB} + 1/r_{XC} + 1/r_{XD} + \ldots) \to \delta_{XA} \times r_{XB} \times (g_X - 1/r_{XA})$. Similarly, the standard error associated with $r_{XB}$ is $\delta_{XB} \times r_{XA} \times (g_X - 1/r_{XB})$. The standard error associated with one of the other nodes in this expression, C for example, is $\delta_{XC} \times r_{XA} \times r_{XB}/r_{XC}^2$.

In some embodiments, the resistance extractor also tracks the statistical error when it finds parallel resistance.

There are multiple approaches to tracking statistical error. The system may simply track statistical error as the network is simplified (this is approximate). The system may generate a deterministic pre-reduced network and reduce, and repeat many times and find statistics (this is accurate). For each element of the original matrix, the system may vary the original value (statistically) and reduce network (same as simplifying matrix) to find resulting error in each final element. This may use sqrt(sum-of-squares) for complete results. And finally, for each element $x_{ij}$ of the original matrix, the system may vary that element slightly ($\Delta x_{ij}$) to find the variation $\Delta y_{kl}$ of each element of the final matrix $y_{kl}$. The sensitivity $S_{ij,kl}$ is the ratio $\Delta y_{kl}/\Delta x_{ij}$. In this case, the system may use sqrt(sum of squares) as above, but each error is product of the sensitivity and uncertainty of the original element.

For a resistor $r_A$ with statistical error of $\delta_A$, the error after placing in parallel to another resistor $r_B$ is $\delta_{B\|A} = \delta_A \times r_B^2/(r_A + r_B)^2$. A similar expression finds the error associated with $r_B$. Assuming the errors are independent, the overall statistical error is the square root of the sum of the squares of the two errors.

Tracking statistical error on the fly during resistor-network reduction is not always exact, because the statistical errors are not necessarily independent, especially when many nodes are generated and eliminated. The following methods can also be used to find the statistical error associated with a reduced network.

An accurate method to find the statistical error of the P2P resistance values is to use simulation. For each simulation, find the P2P resistance values from a "deterministic" conductance matrix. Each element of this deterministic conductance matrix is the original (average) result plus a random value generated with a normal distribution corresponding to the statistical error of that element. Statistical analysis of many simulations may provide P2P resistance values and associated statistical errors that are most consistent with the statistical conductance matrix. Because this approach can be costly in terms of run time in some embodiments, it is reserved for a final report rather than performed after every set of allocated walks.

As a variation of tracking statistical error through simulation, for each element, find all P2P resistance values when that element is varied by one standard error. Subtracting the nominal P2P resistance values (ignoring statistical error) gives the associated errors of all P2P resistance values as associated with the element. Assuming that the errors are independent, the total statistical error is the square root of the sum of the squares of the separate errors. This approach may have a speed advantage over tracking statistical error through simulation, but it fails to account for non-linear effects that make separate errors dependent rather than independent.

Analysis can give the sensitivity of P2P resistance values to each conductance-matrix value. The error of a P2P resistance value is then the square root of the sum over all conductance-matrix of the squares of the sensitivities multiplied by the associated statistical error. This approach may have a speed advantage over tracking statistical error through simulation, but it fails to account for non-linear effects that make separate errors dependent rather than independent, and it fails to account for any non-linear effect of a single error.

Referring again to FIG. 1, at block 168, convergence is tested and, if convergence has not been achieved, the loop from blocks 162 through block 168 is repeated. In some embodiments, checking for convergence involves comparing the statistical error of each P2P resistance value to a goal for that value. Other approaches, such as basing convergence on conductance values or resistor values, may be problematic because some of these values can include a significant amount of statistical error, but not impact P2P resistance.

In some embodiments, the goal for the statistical error $\delta_{AB}$ of a P2P resistance value $R_{AB}$ is the larger of the absolute goal (if specified) and $R_{AB}$ scaled by the relative goal. When no goals are specified, the resistance extractor may use a default value of ±1% for the relative goal.

In some embodiments, the resistance extractor does not consider for convergence any P2P resistance value between two terminals that are both defined as receivers.

In some embodiments, the resistance extractor relaxes the goal for a P2P resistance value when either terminal includes external resistance. The goal in this case is increased by a factor of sqrt($1 + R_{AB}/R_{AB,ext}$), where $R_{AB,ext}$ is the total external resistance defined for terminals A and B. Analyzing a simple net (no branching), when the external resistance associated with a terminal is the value of resistance from that terminal to the end of the net, and when all parts of the net are extracted by resistance extractor with a relative goal of, say, ±1%, this relaxation formula gives faster resistance analysis with a final total resistance that is ±1%, though the individual partitions have a lower relative accuracy.

In some embodiments, the resistance extractor can estimate number of walks left because the statistical error has a predictable behavior as a function of the number of walks performed, namely, the error decreases as the square-root of the number of walks performed. Increasing the number of walks by 4× decreases the error by 2×.

Given the convergence goal and the current statistical errors, in some embodiments the resistance extractor estimates the number of walks left on each net. The total number of walks remaining is the total of the walks remaining on each terminal. The estimated time remaining is simply the number of walks remaining times the walk rate. The total number of walks remaining becomes zero when the resistance extractor converges. In some embodiments, the resistance extractor terminates before it has converged to the goal if the command line includes a runtime limit that is less than the time required for convergence.

Returning to FIG. 1, at block 170, the final output is generated. After a completing a set of allocated walks, the system calculates resistance results and associated statistical errors based on all statistics accumulated since the first set of walks. The resistance extractor may calculate results in several different formats. These formats may include an internal conductance matrix, a resistor matrix, a conductance matrix, P2P resistance results, Y resistors. In some embodiments, the system reduces the resistor network to account for ignored resistance, to eliminate virtual nodes from the reported results, and to find P2P resistance values.

In some embodiments, a summary is output periodically, while the resistance is extracted. In some embodiments, the output is printed to a terminal and to a summary file every 5 seconds or so while extracting resistance. Once it has converged, the system can print out other formats, depending on command-line arguments.

The process then ends at block 180. The final output may be used for a variety of purposes. For example, conductance values may be used by a simulator, resistor values may be used for resistors in a netlist, P2P resistance values may be used to tune parameters of other resistance-extraction methods, evaluate the accuracy of other tools, or checking for version-to-version effects, etc.

Of course, although FIG. 1 presents a flowchart, in some embodiments it is implemented as an interrupt-driven system, such that the device state is changed when a state detection system identifies a change of the state. Additionally, the ordering of state checking is arbitrary.

FIG. 37 is a block diagram of one embodiment of a computer system that may be used. It will be apparent to those of ordinary skill in the art, however that other alternative systems of various system architectures may also be used.

The data processing system illustrated in FIG. 37 includes a bus or other internal communication means 3740 for communicating information, and a processing unit 3710 coupled to the bus 3740 for processing information. The processing unit 3710 may be a central processing unit (CPU), a digital signal processor (DSP), or another type of processing unit 3710.

The system further includes, in some embodiments, a random access memory (RAM) or other volatile storage device 3720 (referred to as memory), coupled to bus 3740 for storing information and instructions to be executed by processor 3710. Main memory 3720 may also be used for storing temporary variables or other intermediate information during execution of instructions by processing unit 3710.

The system also comprises in some embodiments a read only memory (ROM) 3750 and/or static storage device 3750 coupled to bus 3740 for storing static information and instructions for processor 3710. In some embodiments, the system also includes a data storage device 3730 such as a magnetic disk or optical disk and its corresponding disk drive, or Flash memory or other storage which is capable of storing data when no power is supplied to the system. Data storage device 3730 in some embodiments is coupled to bus 3740 for storing information and instructions.

The system may further be coupled to an output device 3770, such as a cathode ray tube (CRT) or a liquid crystal display (LCD) coupled to bus 3740 through bus 3760 for outputting information. The output device 3770 may be a visual output device, an audio output device, and/or tactile output device (e.g. vibrations, etc.)

An input device 3775 may be coupled to the bus 3760. The input device 3775 may be an alphanumeric input device, such as a keyboard including alphanumeric and other keys, for enabling a user to communicate information and command selections to processing unit 3710. An additional user input device 3780 may further be included. One such input device 3780 is cursor control device 3780, such as a mouse, a trackball, stylus, cursor direction keys, or touch screen, may be coupled to bus 3740 through bus 3760 for communicating direction information and command selections to processing unit 3710, and for controlling movement on display device 3770.

Another device, which may optionally be coupled to computer system 3700, is a network device 3785 for accessing other nodes of a distributed system via a network. The communication device 3785 may include any of a number of commercially available networking peripheral devices such as those used for coupling to an Ethernet, token ring, Internet, or wide area network, personal area network, wireless network or other method of accessing other devices. The communication device 3785 may further be a null-modem connection, or any other mechanism that provides connectivity between the computer system 3700 and the outside world.

Note that any or all of the components of this system illustrated in FIG. 37 and associated hardware may be used in various embodiments of the present invention.

It will be appreciated by those of ordinary skill in the art that the particular machine that embodies the present invention may be configured in various ways according to the particular implementation. The control logic or software implementing the present invention can be stored in main memory 3720, mass storage device 3730, or other storage medium locally or remotely accessible to processor 3710.

It will be apparent to those of ordinary skill in the art that the system, method, and process described herein can be implemented as software stored in main memory 3720 or read only memory 3750 and executed by processor 3710. This control logic or software may also be resident on an article of manufacture comprising a computer readable medium having computer readable program code embodied therein and being readable by the mass storage device 3730 and for causing the processor 3710 to operate in accordance with the methods and teachings herein.

The present invention may also be embodied in a handheld or portable device containing a subset of the computer hardware components described above. For example, the handheld device may be configured to contain only the bus 3740, the processor 3710, and memory 3750 and/or 3720.

The handheld device may be configured to include a set of buttons or input signaling components with which a user may select from a set of available options. These could be considered input device #1 3775 or input device #2 3780. The handheld device may also be configured to include an output device 3770 such as a liquid crystal display (LCD) or display element matrix for displaying information to a user of the handheld device. Conventional methods may be used to implement such a handheld device. The implementation of the present invention for such a device would be apparent to one of ordinary skill in the art given the disclosure of the present invention as provided herein.

The present invention may also be embodied in a special purpose appliance including a subset of the computer hardware components described above, such as a kiosk or a vehicle. For example, the appliance may include a processing unit 3710, a data storage device 3730, a bus 3740, and memory 3720, and no input/output mechanisms, or only rudimentary communications mechanisms, such as a small touch-screen that permits the user to communicate in a basic manner with the device. In general, the more special-purpose the device is, the fewer of the elements need be present for the device to function. In some devices, communications with the user may be through a touch-based screen, or similar mechanism. In some embodiments, the device may not provide any direct input/output signals, but may be configured and accessed through a website or other network-based connection through network device 3785.

It will be appreciated by those of ordinary skill in the art that any configuration of the particular machine implemented as the computer system may be used according to the particular implementation. The control logic or software implementing the present invention can be stored on any machine-readable medium locally or remotely accessible to processor 3710. A machine-readable medium includes any mechanism for storing information in a form readable by a machine (e.g. a computer). For example, a machine readable medium includes read-only memory (ROM), random access memory (RAM), magnetic disk storage media, optical storage media, flash memory devices, or other storage media which may be used for temporary or permanent data storage. In some embodiments, the control logic may be implemented as transmittable data, such as electrical, optical, acoustical or other forms of propagated signals (e.g. carrier waves, infrared signals, digital signals, etc.).

In one embodiment, a method of systematically performing resistance extraction in a simulated circuit to improve resistance modeling is described. The method comprises determining a walk weight for a floating random walk, determining a hop size, wherein the hop size accounts for a first reflective boundary condition, determining a hop destination, wherein the hop destination accounts for a second reflective boundary condition, wherein the second reflective boundary condition is the same as or different from the first reflective boundary condition, and performing the floating random walk based on the walk weight, the hop size, and the hop destination.

In one embodiment, determining the hop size comprises searching for objects that limit the hop size. In one embodiment, determining the hop destination comprises reflecting a destination coordinate inside a resistor structure based on the second reflective boundary condition.

In one embodiment, a method for extracting linear parameters for resistance extraction is described. The method comprises inserting a virtual terminal in a resistor structure, the virtual terminal imposing a Dirichlet boundary condition, and eliminating at least one linear parameter involving the virtual terminal. In one embodiment, the virtual terminal is a first virtual terminal, and the Dirichlet boundary condition is a first Dirichlet boundary condition. In one embodiment, the method further comprises inserting a second virtual terminal in the resistor structure, the second virtual terminal imposing a second Dirichlet boundary condition, and determining a resistance between the first virtual terminal and the second virtual terminal using a 1D formula. In one embodiment, the method further comprises reducing an internal resistance network to eliminate a node corresponding to the virtual terminal. In one embodiment, a ratio between a dimension parallel to a 1D current direction and a transverse dimension is larger than a model-squares value.

In one embodiment, a method of extracting resistance is described. The method comprises identifying a calculation surface, the calculation surface separating a first terminal from all other terminals, and performing a calculation involving a second terminal to combine (i) a resistance between the calculation surface and the first terminal and (ii) an effective average of a voltage on the calculation surface.

In one embodiment, the calculation surface is a first calculation surface, and wherein performing the calculation involving the second terminal comprises determining a resistance bounded by the first calculation surface and a second calculation surface.

In one embodiment, a method of modeling a resistance is described. The method comprises simulating a resistor terminal with an infinite-length virtual resistor having finite conductivity, and determining the resistance excluding an effective resistance of the resistor terminal.

In one embodiment, a method of modeling a resistance is described. The method comprising simulating a voltage terminal, the voltage terminal having a finite conductivity and representing a Dirichlet boundary condition, determining the resistance excluding an effective resistance of the resistor terminal.

In one embodiment, a method of modeling a resistance is described. The method comprises determining whether a voltage terminal meets one or more conditions selected from among: (i) the voltage terminal is a single 3D box or a 2D rectangle, (ii) an implied direction of the voltage terminal is unambiguously implied by its relationship to the resistor terminal, (iii) the resistance is unambiguously implied by the resistance terminal, and when the voltage terminal meets the one or more condition, converting the voltage terminal to a resistor terminal.

In one embodiment, a method of modeling a resistance is described. The method comprises generating a linear solution for the resistance, using a negative-value resistor to separate a terminal from a node, and eliminating the node using a resistor-network reduction technique, as a correction to the linear solution. In one embodiment, the resistor-network reduction technique comprises performing a matrix operation. In one embodiment, the node is connected to a second node by a first resistor. In one embodiment, eliminating the first node using the resistor-network reduction technique comprises removing the first resistor and inserting a second resistor to connect the second node to a third node.

In one embodiment a method of generating a resistor-network representation of a network is described. The method comprises generating a resistor structure at a junction between shapes that correspond to a node in a 1D network, extracting a resistance, and ignoring a 1D resistance value.

In one embodiment a method of tracking and simulating statistical error of a reduced-resistance network is described. The method comprises eliminating a first resistor associated with a first node, the first resistor having a statistical error and a value, adding a second resistor between a pair of adjacent nodes, the pair of adjacent nodes not including the first node, eliminating the first node, and determining a statistical error of the second resistor using the statistical error of the first resistor and the value of the first resistor.

In one embodiment, a method of determining a statistical error of a reduced-resistance network in a circuit design is described. The method comprises generating a deterministic conductance matrix using a matrix of values having statistical errors, manipulating the deterministic conductance matrix to generate derived results, accumulating the derived results and a square of the derived results, and generating a final conductance matrix based on an average of the derived results and the statistical errors.

In one embodiment, manipulating the deterministic matrix to generate derived results comprises performing at least one matrix operation. In one embodiment, generating the deterministic conductance matrix comprises using a random-number generator.

In one embodiment, a method of determining a statistical error of a reduced-resistance network is described. The method comprises determining N statistical errors, each of the N statistical errors corresponding to a different element of a simplified deterministic conductance matrix having N elements, using the N statistical errors, determining N variance values, each of the N variance values corresponding to a different element of the manipulated deterministic conductance matrix, each of the N variance values determined using the statistical error corresponding to that element of the N elements, and determining a final statistical error using the N variance values.

In one embodiment, determining the final statistical error using the N variance values comprises calculating a square root of a sum of squares of the N variance values.

In one embodiment, a method of determining a sensitivity of a reduced-resistance network is described. The method comprises determining N sensitivity values, each of the N sensitivity values corresponding to a different element of a manipulated conductance matrix having N elements, using the N sensitivity values, determining N variance values, each of the N variance values corresponding to a different element of the manipulated matrix, each of the N variance values determined using the sensitivity value corresponding to that element of the N elements, and determining a final statistical error using the N variance values. In one embodiment, determining the final statistical error using the N variance values comprises calculating a square root of a sum of squares of the N variance values.

In one embodiment, a method of modeling a resistance is described. The method comprises establishing a goal for a point-to-point (P2P) resistance value, and comparing a statistical error associated with the P2P resistance value to the goal. In one embodiment, the P2P resistance value is associated with at least one terminal designated as a driver.

In one embodiment, a data structure defining an interface between a first material having a first resistivity and a second material having a second resistivity is described. The data structure comprises data about each side of the interface. In one embodiment, the data about each side of the interface indicates how often to hop in a particular direction. In one embodiment, the particular direction is a +x direction, a −x direction, a +y direction, or a −y direction.

In one embodiment, a non-transitory computer-readable medium comprising machine-executable instructions that, when executed by at least one processor, cause the at least one processor to execute a method is described. The medium comprises instructions to read an input file, the input file specifying a resistor structure, modify at least one aspect of the resistor structure, polish data, the data representing the modified resistor structure, initialize at least one walk, and perform the at least one walk. The instructions further comprise providing an output based on the performed at least one walk.

In one embodiment, modifying at least one aspect of the resistor structure comprises inserting at least one virtual terminal in the resistor structure, replacing a first resistance terminal in the resistor structure by an implied resistor structure, defining a voltage terminal having an ignored resistance value, and transforming at least one transform-enabled terminal into a second resistance terminal. In one embodiment, a characteristic of the at least one virtual terminal is dependent on a model-squares parameter. In one embodiment, the model-squares parameter is specified by the input file. In one embodiment, inserting the at least one virtual terminal in the resistor structure comprises placing the virtual terminal so that a distance from a nearest end of a resistor block results in an aspect ratio that is half of the model-squares value. In one embodiment, modifying at least one aspect of the resistor structure comprises replacing a resistance terminal by a voltage terminal at the end of an implied resistor stub.

In one embodiment, a resistivity of the implied resistor stub is equal to the resistivity of the resistance terminal, and a length of the implied resistor stub is selected so that an aspect ratio of the implied resistor stub matches a model-squares parameter of the resistance terminal. In one embodiment, modifying at least one aspect of the resistor structure comprises replacing a transform-enabled terminal by a resistance terminal.

In one embodiment, polishing data comprises reducing the resistor structure to an intermediate representation, generating a calculation surface for a terminal of the resistor structure, and creating an alternate form of the resistor structure. In one embodiment, the alternate form of the resistor structure comprises a reflection plane, a transition plane, an edge, a point, a concave edge, or a concave point. In one embodiment, the calculation surface is an average-voltage-based calculation surface.

In one embodiment, the calculation surface comprises a resistor stub terminating on a terminal. In one embodiment, the calculation surface is a first calculation surface, and wherein creating the alternate form of the resistor structure comprises determining a resistance bounded by the first calculation surface and a second calculation surface.

In one embodiment, polishing data comprises one or more of removing overlap between a first resistor and a second resistor, representing an interface between blocks of the resistor structure as a transition surface, representing an outside of the resistor structure and an interface between materials having different resistivities by one or more of: a reflection plane, a transition data structure, or a concave data structure, storing a boundary of the resistor structure as a plurality of reflection planes, representing an interface at a transition between different resistivity regions by one or more of: a transition plane, a transition edge, or a transition point, and representing an interface at a transition between different resistivity regions by one or more of: a concave edge or a concave point.

In one embodiment, initializing at least one walk comprises pre-calculating data related to a Manhattan-based random walk and initializing a random-number generator, allocating the at least one walk, and calculating results. In one embodiment, allocating the at least one walk comprises one or more of determining a number of walks to perform, allocating the at least one walk to a calculation surface or an integration surface of a terminal of the resistor structure. In on embodiment, performing the at least one walk comprises selecting a point on a calculation surface of a source terminal and performing at least one hop to reach a destination.

In one embodiment, performing the at least one hop comprises determining a hop size and reflecting a coordinate of the destination inside the resistor structure.

In one embodiment, determining the hop size comprises one or more of searching for an object that limits the hop size, accounting for a local reflecting boundary, and determining a relationship between the calculation surface and an object that limits the hop size. In one embodiment, the object that limits the hop size comprises a transition structure, a concave structure, or a terminal.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A non-transitory computer-readable medium comprising machine-executable instructions that, when executed by at least one processor, cause the at least one processor to execute a method comprising:
reading an input file, the input file specifying a resistor structure;
modifying at least one aspect of the resistor structure, wherein modifying at least one aspect of the resistor structure comprises:
inserting at least one virtual terminal in the resistor structure,
replacing a first resistance terminal in the resistor structure by an implied resistor structure,
defining a voltage terminal having an ignored resistance value, and
transforming at least one transform-enabled terminal into a second resistance terminal;
polishing the modified resistor structure into an optimized internal format, to yield a polished modified resistor structure;
initializing at least one walk;
performing the at least one walk; and
providing an output based on the performed at least one walk.

2. The non-transitory computer-readable medium recited in claim 1, wherein a characteristic of the at least one virtual terminal is dependent on a model-squares parameter.

3. The non-transitory computer-readable medium recited in claim 2, wherein the model-squares parameter is specified by the input file.

4. The non-transitory computer-readable medium recited in claim 2, wherein inserting the at least one virtual terminal in the resistor structure comprises placing the virtual terminal so that a distance from a nearest end of a resistor block results in an aspect ratio that is half of the model-squares value.

5. The non-transitory computer-readable medium recited in claim 1, wherein modifying at least one aspect of the resistor structure comprises:
replacing a resistance terminal by a voltage terminal at the end of an implied resistor stub.

6. The non-transitory computer-readable medium recited in claim 5, wherein a resistivity of the implied resistor stub is equal to the resistivity of the resistance terminal, and a length of the implied resistor stub is selected so that an aspect ratio of the implied resistor stub matches a model-squares parameter of the resistance terminal.

7. The non-transitory computer-readable medium recited in claim 1, wherein modifying at least one aspect of the resistor structure comprises:
replacing a transform-enabled terminal by a resistance terminal.

8. The non-transitory computer-readable medium recited in claim 1, wherein polishing the modified resistor structure comprises:
reducing the resistor structure to an intermediate representation;
generating a calculation surface for a terminal of the resistor structure; and
creating an alternate form of the resistor structure.

9. The non-transitory computer-readable medium recited in claim 8, wherein the alternate form of the resistor structure comprises a reflection plane, a transition plane, an edge, a point, a concave edge, or a concave point.

10. The non-transitory computer-readable medium recited in claim 8, wherein the calculation surface is an average-voltage-based calculation surface.

11. The non-transitory computer-readable medium recited in claim 8, wherein the calculation surface comprises a resistor stub terminating on a terminal.

12. The non-transitory computer-readable medium recited in claim 8, wherein the calculation surface is a first calculation surface, and wherein creating the alternate form of the resistor structure comprises:
determining a resistance bounded by the first calculation surface and a second calculation surface.

13. The non-transitory computer-readable medium recited in claim 1, wherein polishing the modified resistor structure comprises one or more of:
removing overlap between a first resistor and a second resistor;
representing an interface between blocks of the resistor structure as a transition surface;
representing an outside of the resistor structure and an interface between materials having different resistivities by one or more of: a reflection plane, a transition data structure, or a concave data structure;
storing a boundary of the resistor structure as a plurality of reflection planes;
representing an interface at a transition between different resistivity regions by one or more of: a transition plane, a transition edge, or a transition point; and
representing an interface at a transition between different resistivity regions by one or more of: a concave edge or a concave point.

14. The non-transitory computer-readable medium recited in claim 1, wherein initializing at least one walk comprises one or more of:
pre-calculating data related to a Manhattan-based random walk and initializing a random-number generator; and
allocating the at least one walk, and calculating results.

15. The non-transitory computer-readable medium recited in claim 14, wherein allocating the at least one walk comprises one or more of:
determining a number of walks to perform;
allocating the at least one walk to a calculation surface or an integration surface of a terminal of the resistor structure.

16. The non-transitory computer-readable medium recited in claim 1, wherein performing the at least one walk comprises:
selecting a point on a calculation surface of a source terminal and performing at least one hop to reach a destination.

17. The non-transitory computer-readable medium recited in claim 16, wherein performing the at least one hop comprises:
determining a hop size; and
reflecting a coordinate of the destination inside the resistor structure.

18. The non-transitory computer-readable medium recited in claim 16, wherein determining the hop size comprises one or more of:
searching for an object that limits the hop size;
accounting for a local reflecting boundary; and
determining a relationship between the calculation surface and an object that limits the hop size.

19. The non-transitory computer-readable medium recited in claim 18, wherein the object that limits the hop size comprises a transition structure, a concave structure, or a terminal.

20. A method utilizing an integrated circuit design tool, including evaluating a resistor structure, the method comprising:
reading an input file, the input file specifying the resistor structure;
modifying at least one aspect of the resistor structure, wherein modifying at least one aspect of the resistor structure comprises:
inserting at least one virtual terminal in the resistor structure,
replacing a first resistance terminal in the resistor structure by an implied resistor structure,
defining a voltage terminal having an ignored resistance value, and
transforming at least one transform-enabled terminal into a second resistance terminal;
polishing the modified resistor structure into an optimized internal format, to yield a polished modified resistor structure;
initializing at least one walk;
performing the at least one walk; and
providing an output based on the performed at least one walk to the integrated circuit design tool for designing an integrated circuit.

21. The method of claim 20, wherein the walk is a floating random walk.

22. The method of claim 20, wherein polishing the modified resistor structure comprises:
reducing the resistor structure to an intermediate representation;
generating a calculation surface for a terminal of the resistor structure; and
creating an alternate form of the resistor structure.

* * * * *